US 9,339,917 B2

(12) United States Patent
Stillwagon

(10) Patent No.: US 9,339,917 B2
(45) Date of Patent: May 17, 2016

(54) METER PULLER WITH SAFETY SHIELD

(75) Inventor: James R. Stillwagon, Columbus, OH (US)

(73) Assignee: Kilvert, LLC, Dublin, OH (US)

(\*) Notice: Subject to any disclaimer, the term of this patent is extended or adjusted under 35 U.S.C. 154(b) by 916 days.

(21) Appl. No.: 13/618,812

(22) Filed: Sep. 14, 2012

(65) Prior Publication Data

US 2013/0014364 A1    Jan. 17, 2013

Related U.S. Application Data

(63) Continuation-in-part of application No. 13/354,034, filed on Jan. 19, 2012, now Pat. No. 9,156,140, which is a continuation-in-part of application No. 12/779,577, filed on May 13, 2010, now abandoned.

(51) Int. Cl.
| B25B 27/02 | (2006.01) |
| B25B 27/14 | (2006.01) |
| B25B 9/00 | (2006.01) |
| B25B 27/00 | (2006.01) |

(52) U.S. Cl.
CPC . *B25B 9/00* (2013.01); *B25B 27/00* (2013.01); *B25B 27/02* (2013.01); *B25B 27/14* (2013.01); *Y10T 29/53909* (2015.01)

(58) Field of Classification Search
CPC ........ B25B 27/00; B25B 27/14; B25B 27/02; B25B 9/00; Y10T 29/53283; Y10T 29/49822; Y10T 29/49002; G01R 11/04
See application file for complete search history.

(56) References Cited

U.S. PATENT DOCUMENTS

| 3,044,158 | A | * | 7/1962 | Bushuell | ................. | H01J 9/003 |
| | | | | | | 29/278 |
| 3,197,848 | A | | 8/1965 | Eichacker | | |
| 3,570,103 | A | | 3/1971 | Price | | |
| 3,934,326 | A | * | 1/1976 | Owen | ................... | G01D 11/30 |
| | | | | | | 29/278 |
| 4,122,599 | A | * | 10/1978 | Lunycz | .............. | H05K 13/0447 |
| | | | | | | 29/267 |

(Continued)

OTHER PUBLICATIONS

Utility Solutions Catalog Cover and Meter Grabber pages, 3 pages, revised Sep. 2007.

(Continued)

*Primary Examiner* — Livius R Cazan
*Assistant Examiner* — Jeffrey T Carley
(74) *Attorney, Agent, or Firm* — Sand & Sebolt; Howard L. Wernow

(57) ABSTRACT

A tool for installing and removing an electrical power meter including a sleeve member defining a cavity therein with an opening to the cavity defined in the sleeve member's first end. An adjustment mechanism on the sleeve member is movable between a first position where the opening is enlarged to permit entry of a portion of the meter into the cavity; and a second position where the opening is reduced. An engagement assembly at the first end of the sleeve member grippingly engages the meter when the adjustment assembly is in the second position. The engagement assembly includes a pair of locking lips which each receive part of a peripheral edge of the meter's base therein. Gaps are defined between the locking lips to enable venting of any electrical discharge therethrough. A removable shield may be secured to the second end of the sleeve member.

18 Claims, 29 Drawing Sheets

(56) References Cited

U.S. PATENT DOCUMENTS

| | | | | |
|---|---|---|---|---|
| 4,450,504 | A | | 5/1984 | Severson |
| 4,907,334 | A | * | 3/1990 | Carver .................... B25B 27/02 29/278 |
| 5,097,581 | A | * | 3/1992 | Williams ............... G01R 11/04 29/267 |
| 5,444,907 | A | | 8/1995 | Becker |
| 6,679,723 | B1 | * | 1/2004 | Robinson ................. G01R 1/04 324/156 |
| 6,823,563 | B2 | | 11/2004 | Robinson et al. |
| 2003/0015330 | A1 | | 1/2003 | Wood et al. |
| 2011/0277294 | A1 | | 11/2011 | Stillwagon |

OTHER PUBLICATIONS

Internet Archive Page of Utility Solutions Web Page, Metering Tools, 1 page, publicly available as of Apr. 9, 2008.

Internet Archive Page of Utility Solutions Web Page, 1 page, publicly available as of Mar. 29, 2009.

Internet Archive Page of Utility Solutions Web Page, Meter Grabber, 2 pages, publicly available as of May 7, 2010.

Gary Guard Advertisement, 5 pages, document is undated but it is believed the document is older than May 13, 2010.

* cited by examiner

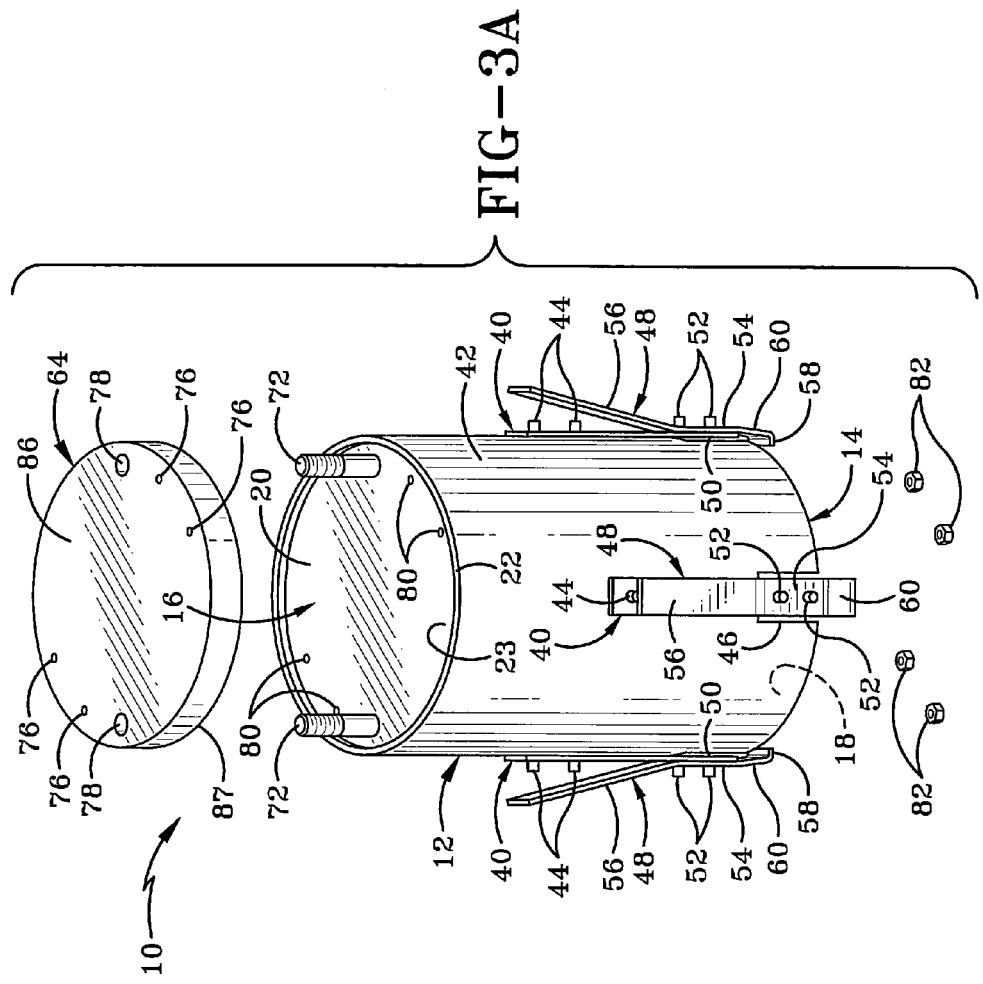

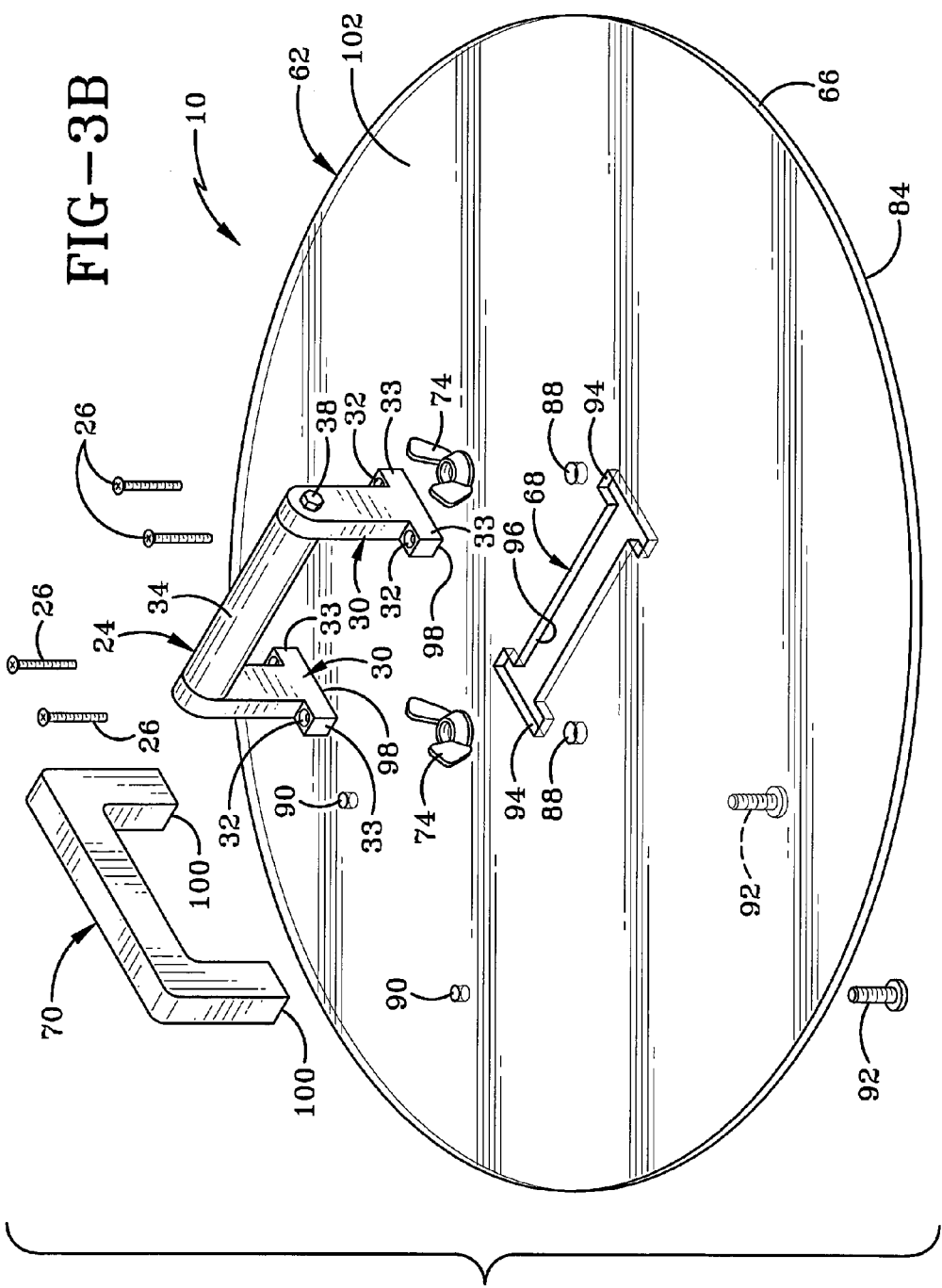

US 9,339,917 B2

METER PULLER WITH SAFETY SHIELD

CROSS-REFERENCE TO RELATED APPLICATION

This application is a Continuation-in-Part of U.S. patent application Ser. No. 13/354,034, filed Jan. 19, 2012 which is a Continuation-in-Part of U.S. patent application Ser. No. 12/779,577, filed May 13, 2010; the entire specifications of which are incorporated herein by reference.

BACKGROUND OF THE INVENTION

1. Technical Field

The invention relates generally to a tool for installing and removing electrical power meters. More particularly, the invention relates to a tool with a shield for removing electrical power meters. Specifically, the invention relates to a tool with a removable shield that can be used to protect a user while installing and removing electrical power meters and where the tool includes a mechanism for opening and closing an opening to a cavity into which the meter is received; and an engagement assembly which engages a base region of the meter to retain it within the tool's cavity.

2. Background Information

Electrical power meters must be occasionally removed and installed on electrical power distribution boxes or housings. The electrical meters can be removed by hand but there is a great deal of danger due to the high current, risk of electrocution, and electrical arc explosion that creates arc thermal energy and a pressure wave and fragmentation.

U.S. Pat. No. 5,097,581 is directed to an electrical power meter installing/removing apparatus that fits around the perimeter of the meter base and locks in place with snapping tabs. The operator then pulls back on the tool and removes the meter from the distribution box. While the apparatus includes a handle proximate the back end of the tool, the tool does not protect the user from electrocution or explosion which may occur at the connection between the power meter and the distribution box when the meter is removed.

SUMMARY OF THE INVENTION

The present invention broadly comprises a tool for installing and removing an electrical power meter comprising a sleeve member adapted for sliding movement about the meter and having a first end opposite a second end, a plurality of releasable gripping hooks mounted on the first end of the sleeve member for selectively engaging the meter, an attaching hook member extending outwardly from the first end of the sleeve member, and a shield secured to the second end of the sleeve member.

The present invention also broadly comprises a method of removing an electrical power meter comprising the steps of providing a sleeve member having a first end with a plurality of releasable gripping hooks and an actuating hook member extending outwardly from the first end of the sleeve member and a second end with a handle, mounting a shield with a handle on the sleeve member second end, sliding the sleeve member onto the power meter until the attaching hook members surround a power meter gripping collar, grasping the second end handle and the shield handle, and pulling the sleeve member handle and the shield member in a direction away from the power meter.

The present invention also broadly comprises a method of removing an electrical power meter comprising the steps of securing a shield to a meter puller, wherein a first side of the shield abuts the back end, and operating a clamping system of the meter puller from the safety of a second side of the shield.

An alternative embodiment of the invention comprises a tool for installing and removing an electrical power meter which includes a sleeve member defining a cavity therein, with an opening to the cavity defined in the sleeve member's first end. An adjustment mechanism on the sleeve member is movable between a first position where the opening is enlarged to permit entry of a portion of the meter into the cavity; and a second position where the opening is reduced. An engagement assembly at the first end of the sleeve member grippingly engages the meter when the adjustment assembly is in the second position. The engagement assembly includes a pair of locking lips which each receive part of a peripheral edge of the meter's base therein. Gaps are defined between the locking lips to enable venting of any electrical discharge therethrough. A removable shield may be secured to the second end of the sleeve member.

BRIEF DESCRIPTION OF THE DRAWINGS

The preferred embodiment of the invention, illustrative of the best mode in which Applicants have contemplated applying the principles of the invention, are set forth in the following description and are shown in the drawings.

FIG. 3A is an exploded view of the sleeve member shown with an intermediate member and connecting fasteners;

FIG. 3B is an exploded view of the safety shield and handles;

Similar numbers refer to similar parts throughout the drawings.

DESCRIPTION OF THE PREFERRED EMBODIMENT

Figure 1:
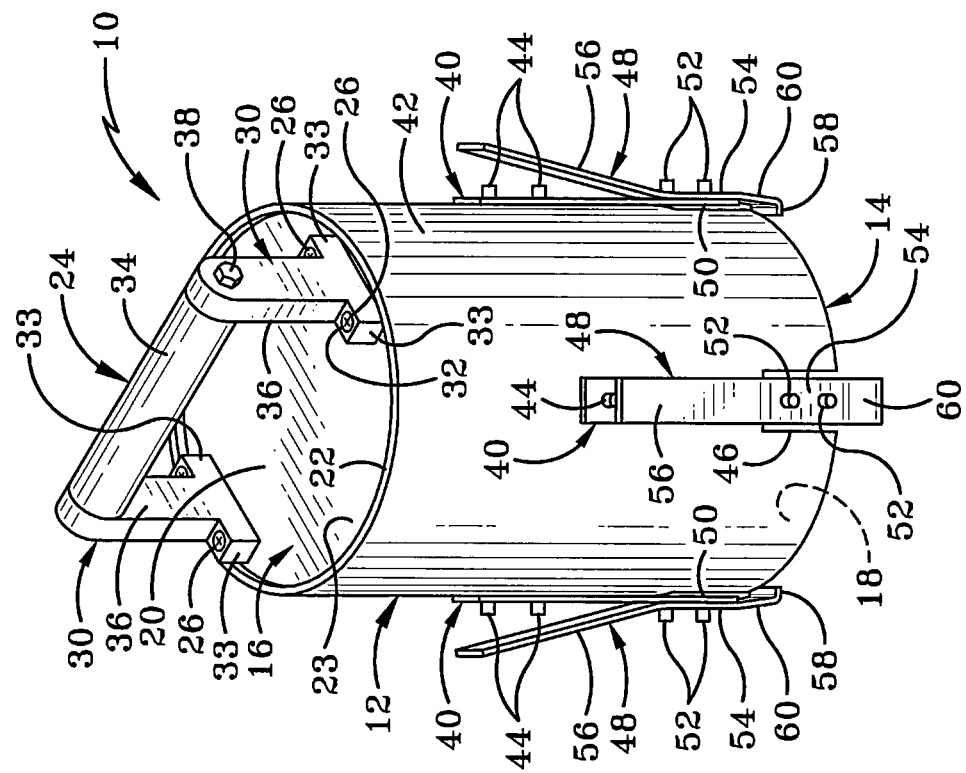
FIG. 1 is a perspective view of a sleeve member of a first embodiment of the invention with releasable gripping hooks and attaching hooks.

At the outset, it should be appreciated that like drawing numbers on different drawing views identify identical, or functionally similar, structural elements of the invention. While the present invention is described with respect to what is presently considered to be the preferred embodiment, it is to be understood that the invention as claimed is not limited to the disclosed aspects.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

The tool of the present invention is indicated generally at 10, and is particularly shown in FIGS. 1 through 9. As particularly shown in FIG. 1, a sleeve member 12 includes a first end 14 opposing a second end 16. First end 14 includes an opening 18, while top end 16 is enclosed by a top surface 20. Further, top surface 20 is recessed within a lip portion 22 of sleeve member 12 which defines a cavity 23.

A handle 24 is connected to second end 16 through fasteners 26 and holes 28 (not shown in FIG. 1). Handle 24 generally consists of a pair of posts 30 having holes 32 on tabs 33 for receiving fasteners 26 and a central rod 34 disposed between inner surfaces 36 of post 30 and connected to the post with fasteners 38. Accordingly, handle 24 is removable by unscrewing fasteners 26.

Sleeve member 12 is preferably cylindrical in shape and formed of a rigid material such as plastic. In a preferred embodiment, four attachment hooks 40 are mounted on an outer surface 42 of sleeve member 12 with a pair of rivets 44. Attachment hooks 40 are preferably thin strips of metal which extend for approximately half of a length of the sleeve member and terminate proximate first end 14 of sleeve member 12. Further, the width of the attachment hooks is preferably just smaller than guide opening 46 in first end 14.

A gripping hook 48 is secured to a terminal end 50 of attachment hook 40 with a pair of rivets 52 which may extend into guide opening 46. Gripping hooks 48 preferably include a flat portion 54 near the rivets and an angled portion 56 extending upward from the rivets to provide a lever arm for hook portion 58. Hook portion 58 is connected to flat portion 54 through lower angled portion 60. Hook portion 58 is preferably generally perpendicular to lower angled portion 60 so as to grip on to the power meter base. Further, angled portion 56 permits the hook portion 58 to be directed radially outward by compressing the angled portion 56 towards sleeve member outer surface 42.

Figure 2:
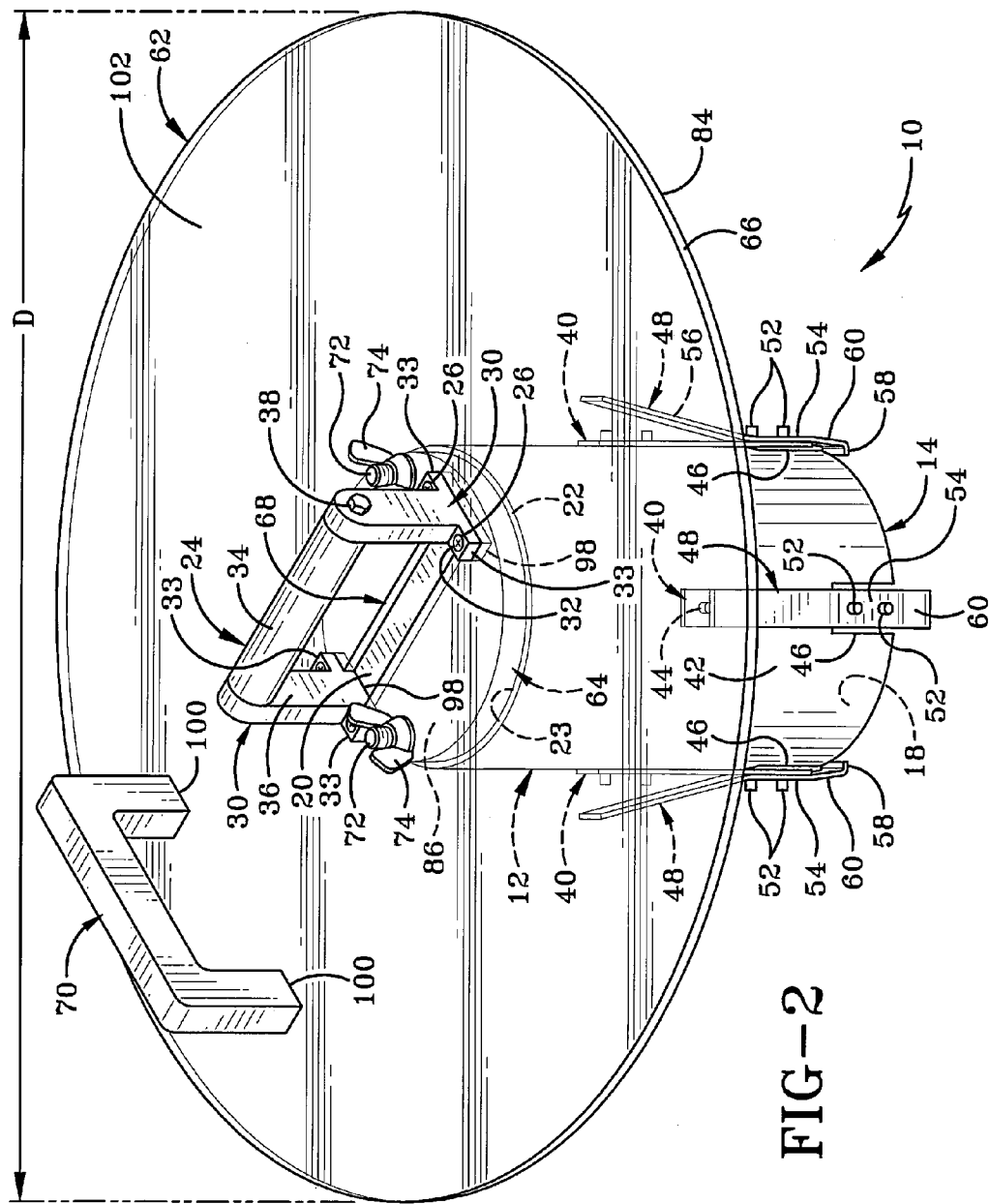
FIG. 2 is a perspective view of the sleeve member with a safety shield having a handle secured thereon.

Referring now to FIG. 2, sleeve member 12 is shown with a shield 62 connected to sleeve member 12. Further, an intermediate member 64 is located between shield 62 and sleeve member second end 16. Shield 62 includes an outer surface 66 and a central opening 68. Central opening 68 is preferably sized and shaped complementary to handle 24 so that the shield can be installed vertically around handle 24 when the handle is secured to sleeve member second end 16. Further, shield 62 also includes a handle 70 arranged generally perpendicular to second end handle 24 to provide a comfortable orientation for the operator. Shield 62 rests atop intermediate member 64 and is secured to the intermediate member and the sleeve member with threaded studs 72 and fasteners 74. Finally, shield 62 is preferably sized to protect an operator and may range anywhere from the diameter of sleeve member second end 16 to well over 24 inches. However, in a preferred embodiment the shield diameter is approximately 18 inches to 24 inches and is particularly 24 inches in the preferred embodiment. Shield 62 is preferably composed of a clear rigid plastic material that is capable of withstanding electrocution and a significant impact. Shield 62 may also be composed of a flame retardant transparent polycarbonate shield or may include a plurality of shields stacked one atop of the other.

FIGS. 3A and 3B illustrate an exploded view of the first preferred embodiment tool 10. As can be particularly seen in FIG. 3A, intermediate member 64 is preferably cylindrical in shape and includes a plurality of holes 76 for receiving fasteners 26. A plurality of holes 78 permit threaded studs 72 to extend there through and secure shield 62 to sleeve member second end 16. Further, FIG. 3A illustrates a plurality of apertures 80 within second end 16 for receiving fasteners 26 of the handle as shown in FIG. 3B. Further, nuts 82 secure handle 24 and fasteners 26 to the intermediate member 64 and sleeve member 12. Intermediate member 64 is preferably cylindrical in shape and sized to fit within lip portion 22 of second end 16. Further, intermediate member 64 preferably has a thickness greater than the height of lip portion 22 to extend the shield contact surface above lip portion 22. Specifically, a bottom surface 84 of shield 62 contacts a top surface 86 of intermediate member 64 above lip portion 22, while a bottom surface 87 of the intermediate member 64 contacts top surface 20.

Referring specifically to FIG. 3B, safety shield 62 is shown with a pair of apertures 88 for receiving threaded studs 72 of second end 16. Shield 62 also includes a pair of apertures 90 for receiving fasteners 92 to connect handle 70 to shield 62. Further, central opening 68 is again shown complementary shaped to handle 24 and includes a pair of rectangular openings 94 at each end and a slot 96 for permitting passage of handle central rod 34 during installation, while rectangular openings 94 permit passage of posts 30 during installation.

Accordingly, a bottom surface 98 of post 30 rests flush with bottom surface 84 of shield 62 when fully installed, while a bottom surface 100 of handle 70 rests on a top surface 102 of the shield 62 after installation. Therefore, handle 70 is preferably shorter than handle 24 to ensure that the handles are aligned at the same height. In a preferred embodiment, handle 70 is shorter than handle 24 by the same thickness as shield 62.

Figure 4:
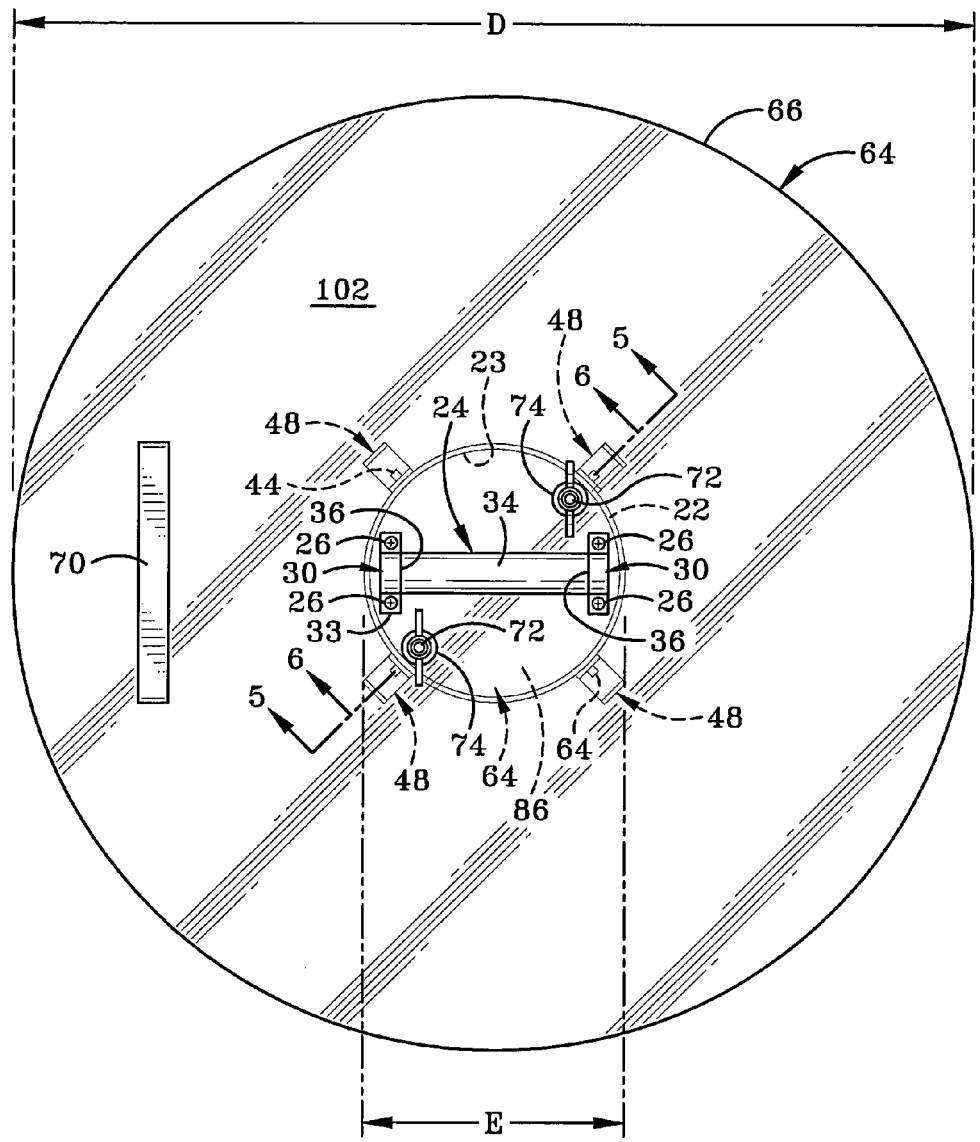
FIG. 4 is a top plan view of the safety shield secured to the sleeve member.
Figure 5:
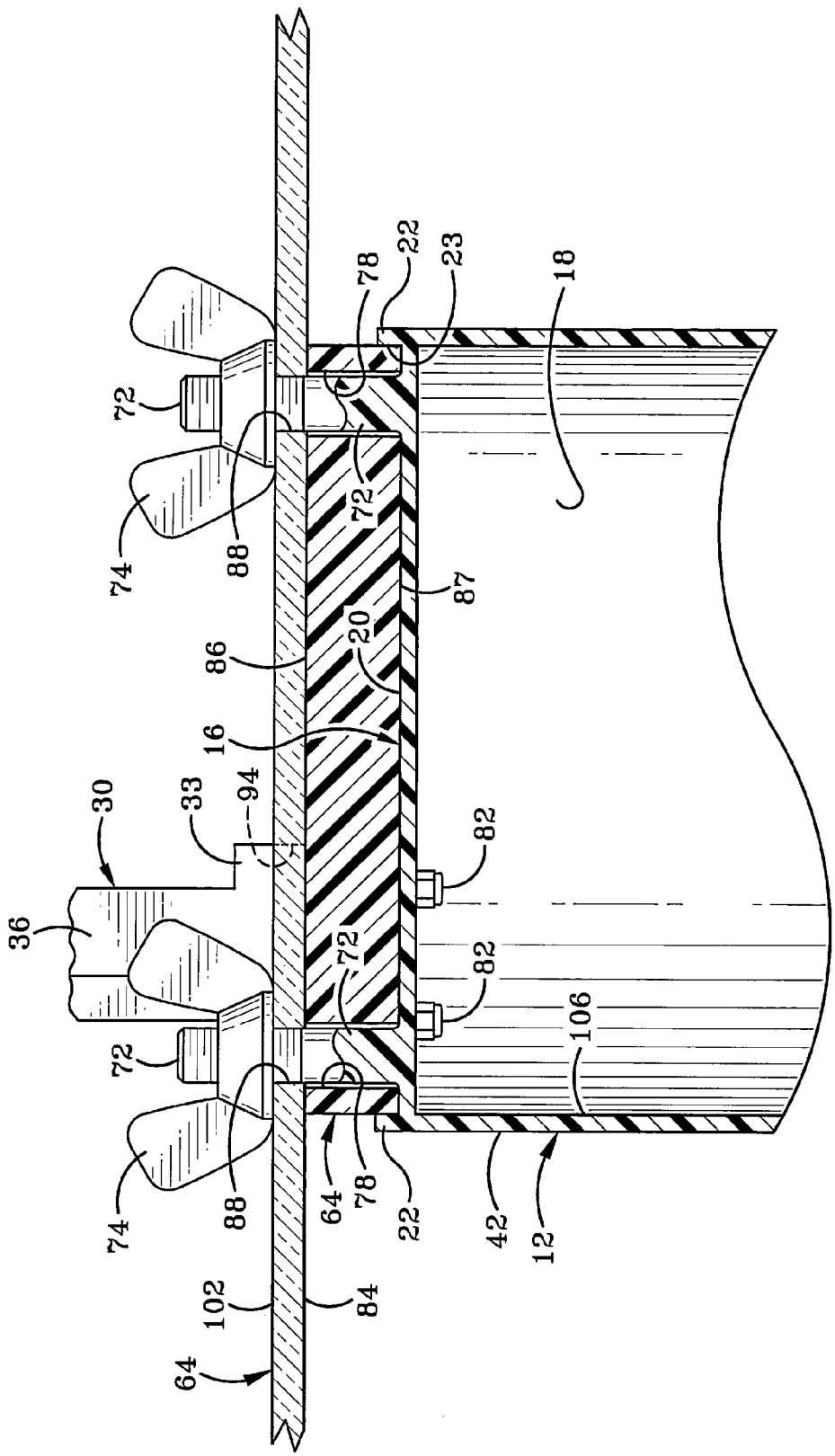
FIG. 5 is a partial cross-sectional view of the sleeve member and safety shield taken generally about Line 5-5 in FIG. 4.
Figure 6:
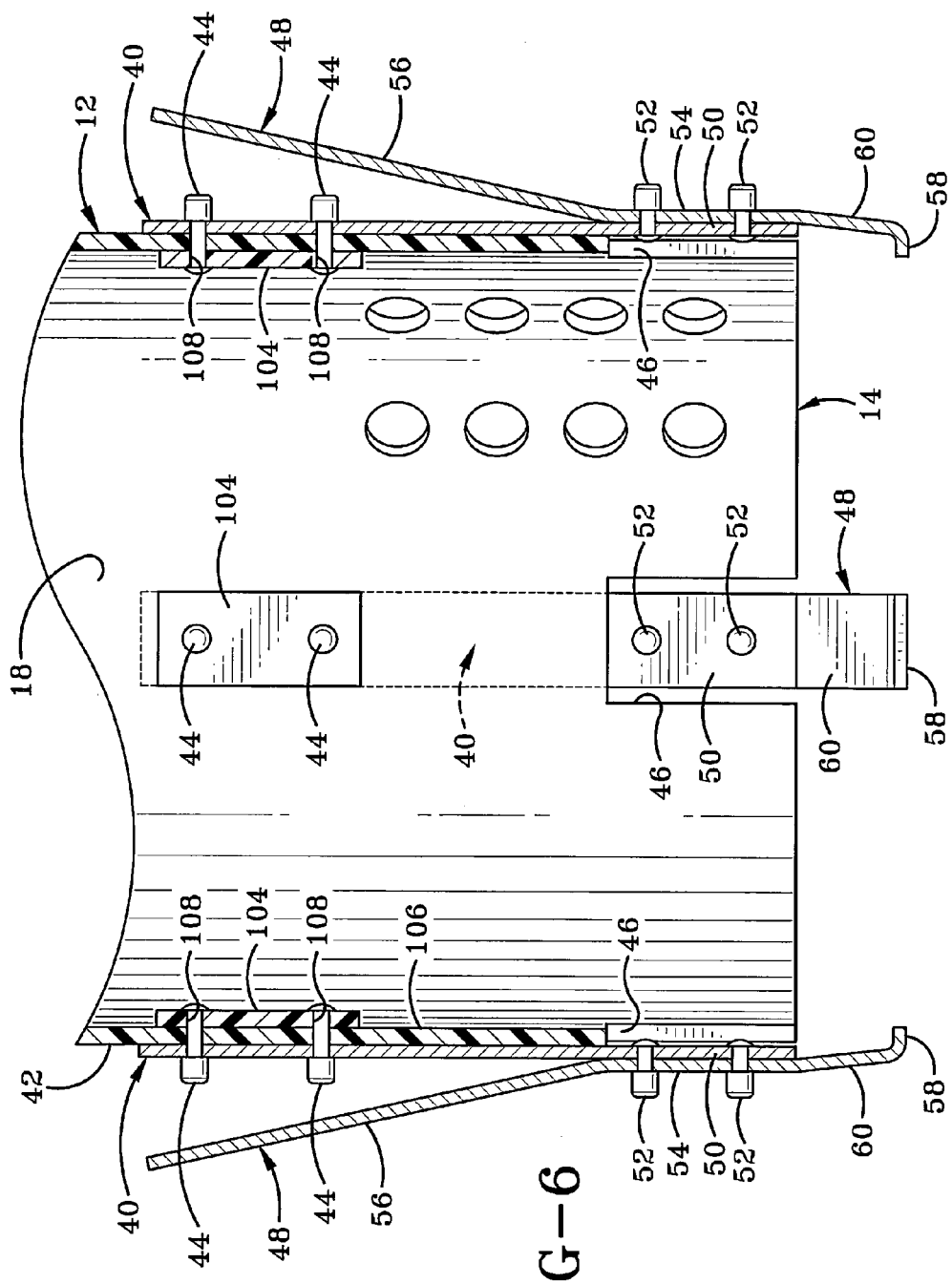
FIG. 6 is a partial cross-sectional view of the sleeve member taken generally about Line 6-6 in FIG. 4.

FIGS. 4, 5, and 6 illustrate the arrangement of the meter puller 10 and shield 62 components. As seen in FIG. 4, diameter D of shield 62 is preferably larger than diameter E of sleeve member 12. Further, the orientation of handle 24 with respect to handle 70 is seen in greater detail to allow the operator to more naturally use the meter puller and shield. Still further, this view illustrates the larger range of protection for the operator.

FIG. 5 illustrates a cross-sectional view showing second end 16 with studs 72 integral to the second end and intermediate member 64 surrounding the studs 72. FIG. 5 also illustrates opening 18 extending upward from first end 14 all the way to second end 16. Still further, this view illustrates lip portion 22 extending partially up the thickness of intermediate member 64 and intermediate member 64 extending far above lip portion 22. While studs 72 are shown integral to the second end 16, the studs 16 could be removably secured to the second end 16 with nuts.

FIG. 6 illustrates a cross-sectional view of first end 14 illustrating gripping hook 48 secured to outer surface 42 of sleeve member 12 with rivets 44. In addition, an absorbing mount 104 is located proximate an inner surface 106 of sleeve member 12. Absorbing mount 104 preferably includes a pair of apertures 108 arranged to receive rivets 44 and particularly mount attachment hook 40 to sleeve member 12. Absorbing mount 104 is preferably constructed of a rigid plastic but may also be constructed of a more flexible material and is useful to reduce the bending moment that is created by operating angle portion 56.

Having described the structure of the preferred embodiment, a preferred method of operation will be described in detail and should be read in light of FIGS. 1 through 9 and particularly FIGS. 7 through 9.

Figure 7:
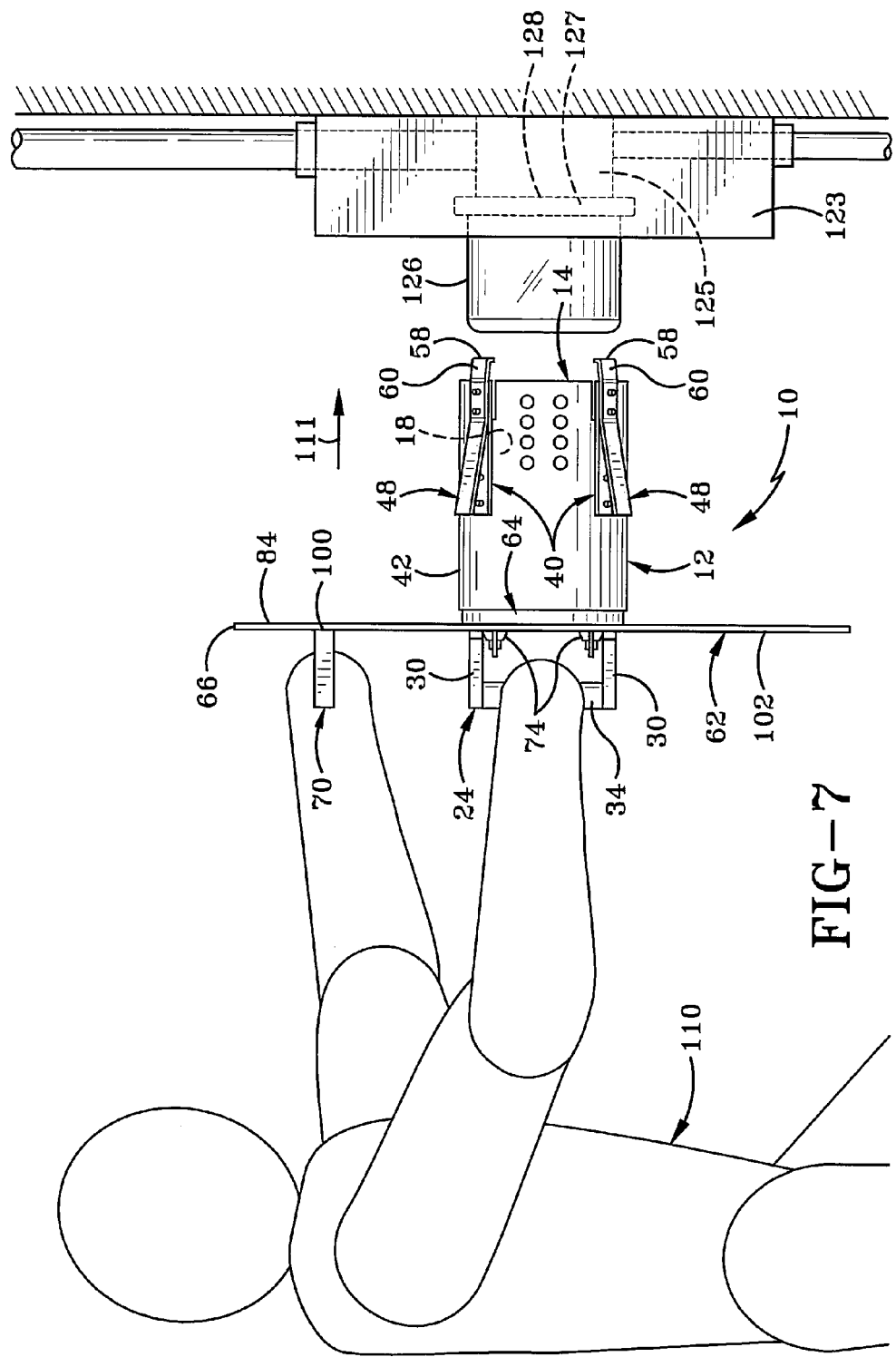
FIG. 7 is an operational view showing an operator gripping the handles and forcing the sleeve member and safety shield in the direction of a power meter.
Figure 8:
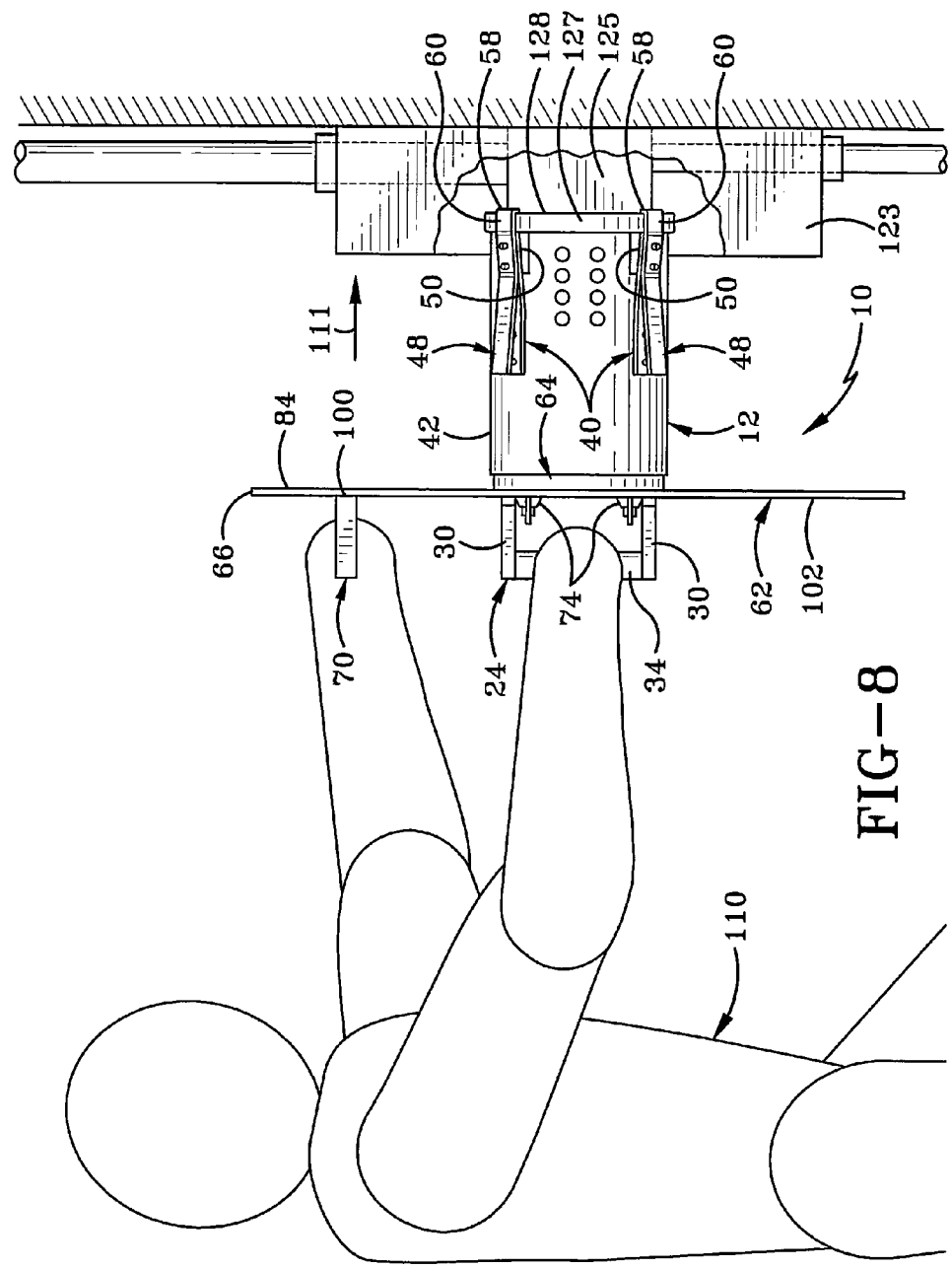
FIG. 8 is an operational view showing the installer forcing the sleeve member on to the power meter.
Figure 9:
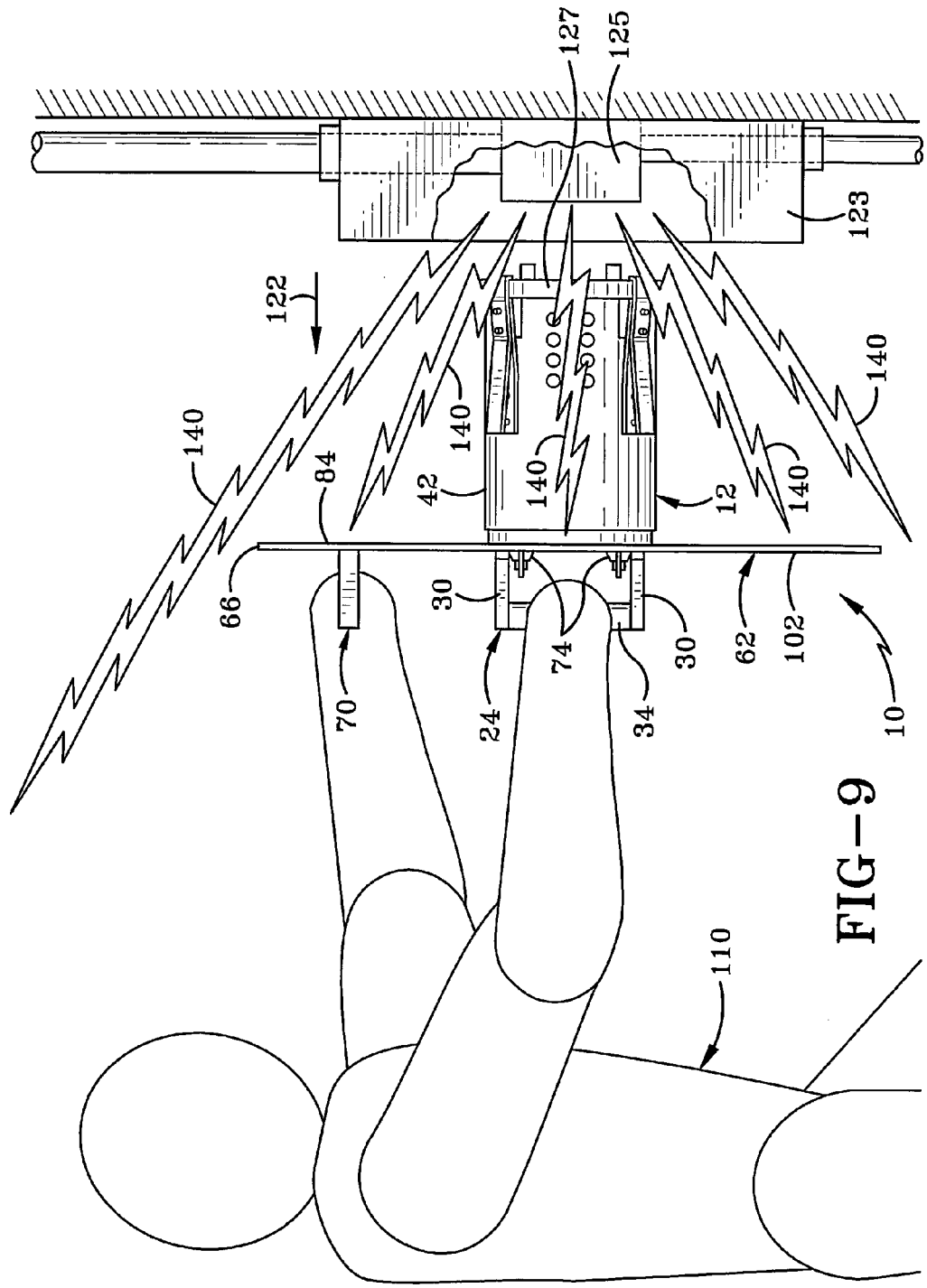
FIG. 9 is an operational view of the operator removing the power meter with the sleeve member and an electrical explosion being deflected around the safety shield.

FIGS. 7 through 9 illustrate the operation of the tool after shield 62 has been secured on intermediate member 64 and second end 16 as shown in FIGS. 3A, 3B, and 5. Referring now to FIG. 7, an operator 110 grasps tool 10 at handles 24 and 70 and moves the tool in a direction associated with arrow 111 towards electrical power meter 126 having a base 127. As seen in FIG. 8, the operator continues to move the tool in a direction associated with arrow 111 until hook portions 58 interlockingly engage the meter for removal of the same from distribution box 123.

FIG. 9 illustrates removal of the electrical meter by pulling tool 10 in direction associated with arrow 122 away from a distribution box 123 and particularly meter mount 125. Should an electrical explosion or electrical discharge occur during the removal of meter 126, a blast 140 will be sent towards the operator and deflected by shield 62 or, due to the size of the shield, pass radially outward of the shield and thereby missing the operator. Advantageously, this shield arrangement provides a greater cone of protection for the operator to reduce the risk and damage that a blast may cause during electrical power meter removal and installation. Still further, the shield provides greater dexterity for the user in that there are two handles to guide the tool on to the power meter as well as during the removal and installation process.

Alternatively, the operator may use a strap wrench or other suitable tool to compress angled portions 56 on each gripping hook 48. Advantageously, using a strap wrench allows the operator to compress the gripping hooks and surround the power meter while reducing the operator's risk of being electrocuted.

Thus, tool 10 provides an apparatus for protecting a user as well as additional assistance during the installation and removal of electrical power meters. Further, the tool is easily transportable as shield 62 may be easily removed to allow for storage. The shield provides a cone of protection with greater heat attenuation for the user with increasing the user's control over the meter puller by using two hands.

It will be evident to one of skilled in the art that a variety of changes can be made that are within the spirit and scope of the present invention. For instance, the sleeve member and shield may be composed of the same or different materials and can be manufactured of a variety of colors, including translucent colors. Further, the size of the shield and the length of the sleeve member may be adjusted to accommodate specific users or specific power meters.

In a second embodiment of the present invention, an enhanced meter puller 101 is shown in FIGS. 10-21, and described hereinafter.

Figure 10:
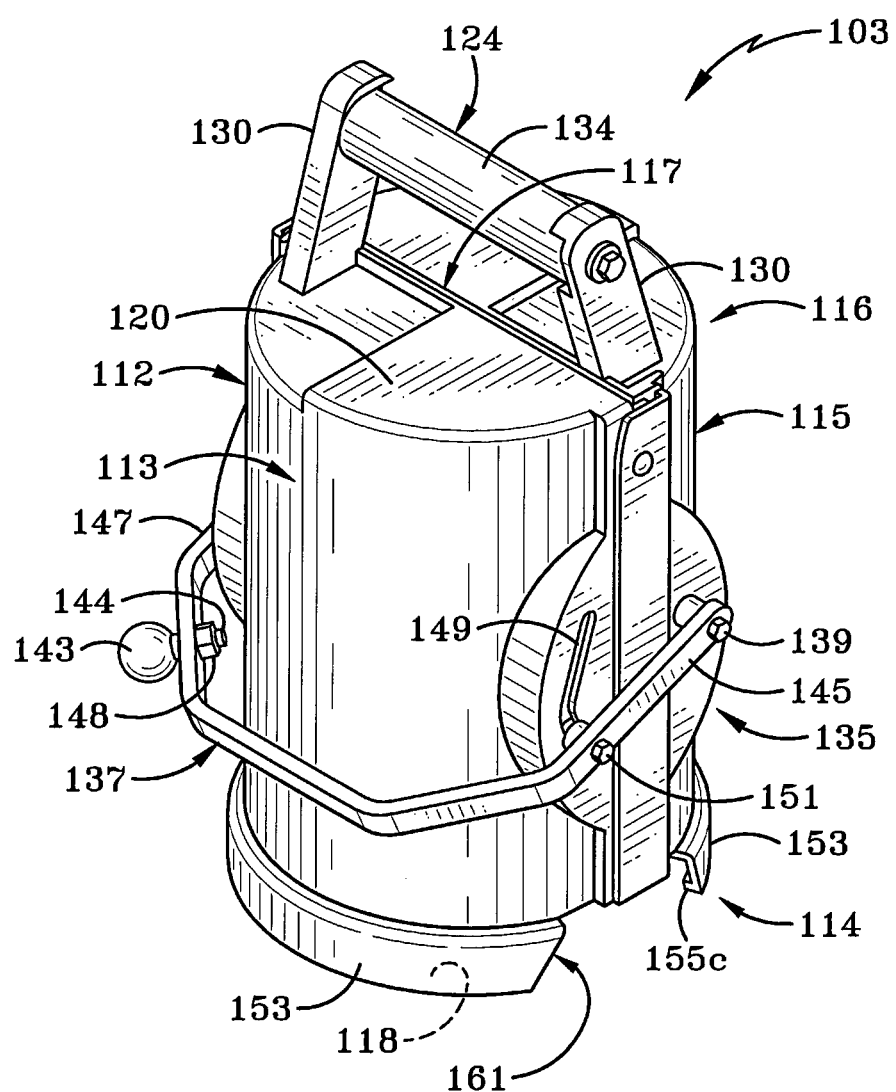
FIG. 10 is a perspective view of a sleeve member of a second embodiment of the invention with a clamping system for actuating a pair of lips to grip and release the meter.
Figure 14:
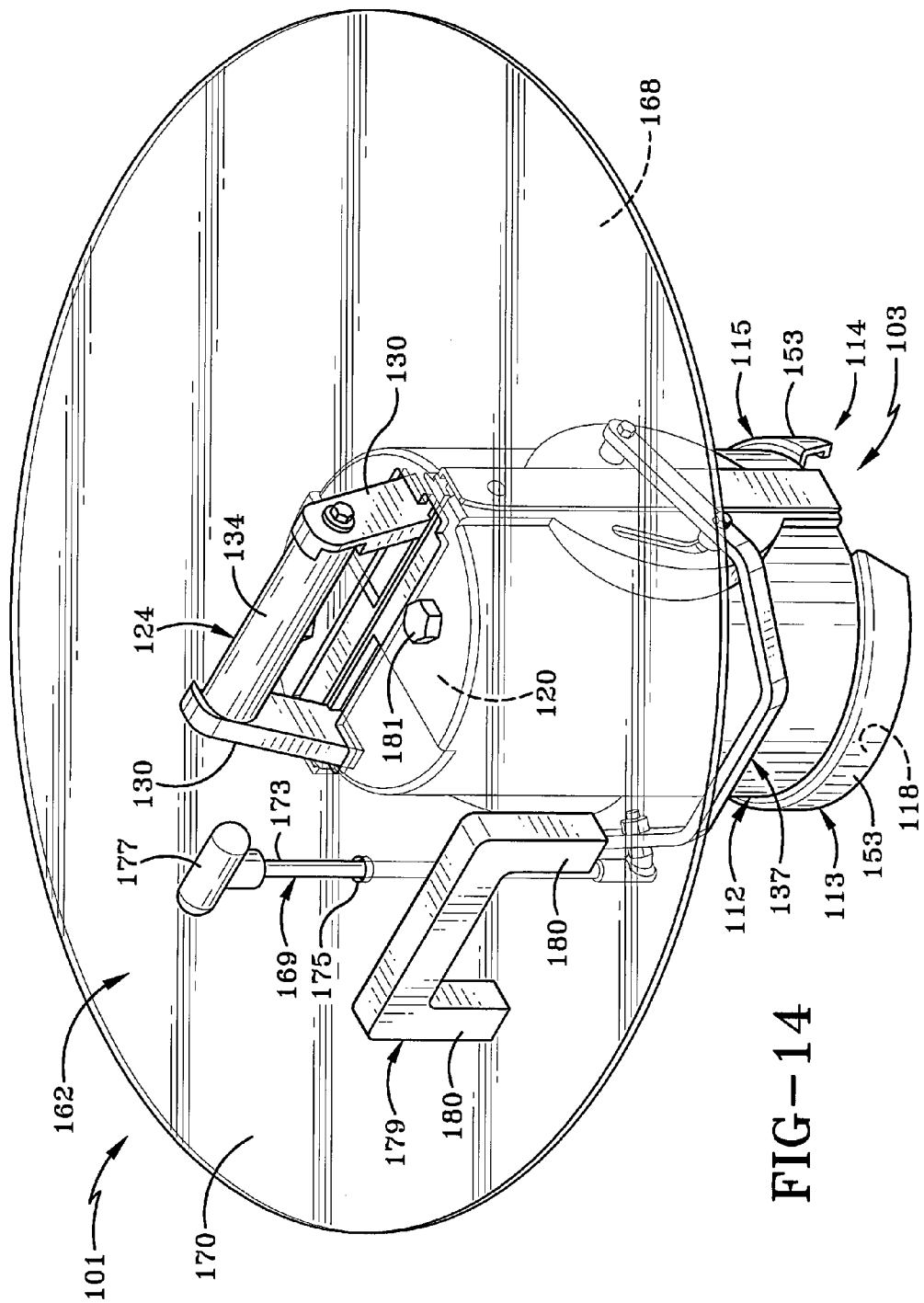
FIG. 14 is a perspective view of an enhanced meter puller of the present invention.

As shown in FIGS. 10 and 14, enhanced meter puller 101 includes a meter puller 103, which may be embodied by any common off-the-shelf meter puller. Shown particularly in FIG. 10, meter puller 103 includes a sleeve member 112 which extends from a first end 114 to a second end 116. First end 114 defines an opening 118, while a top surface 120 is disposed at second end 116. A pair of posts 130 extends outwardly away from top surface 120 and receive a central rod 134 therebetween to form a handle 124. Sleeve member 112 is comprised of a first sleeve portion 113 coupled with a second sleeve portion 115, wherein first sleeve portion 113 and second sleeve portion 115 are movable with respect to each other.

Figure 16:
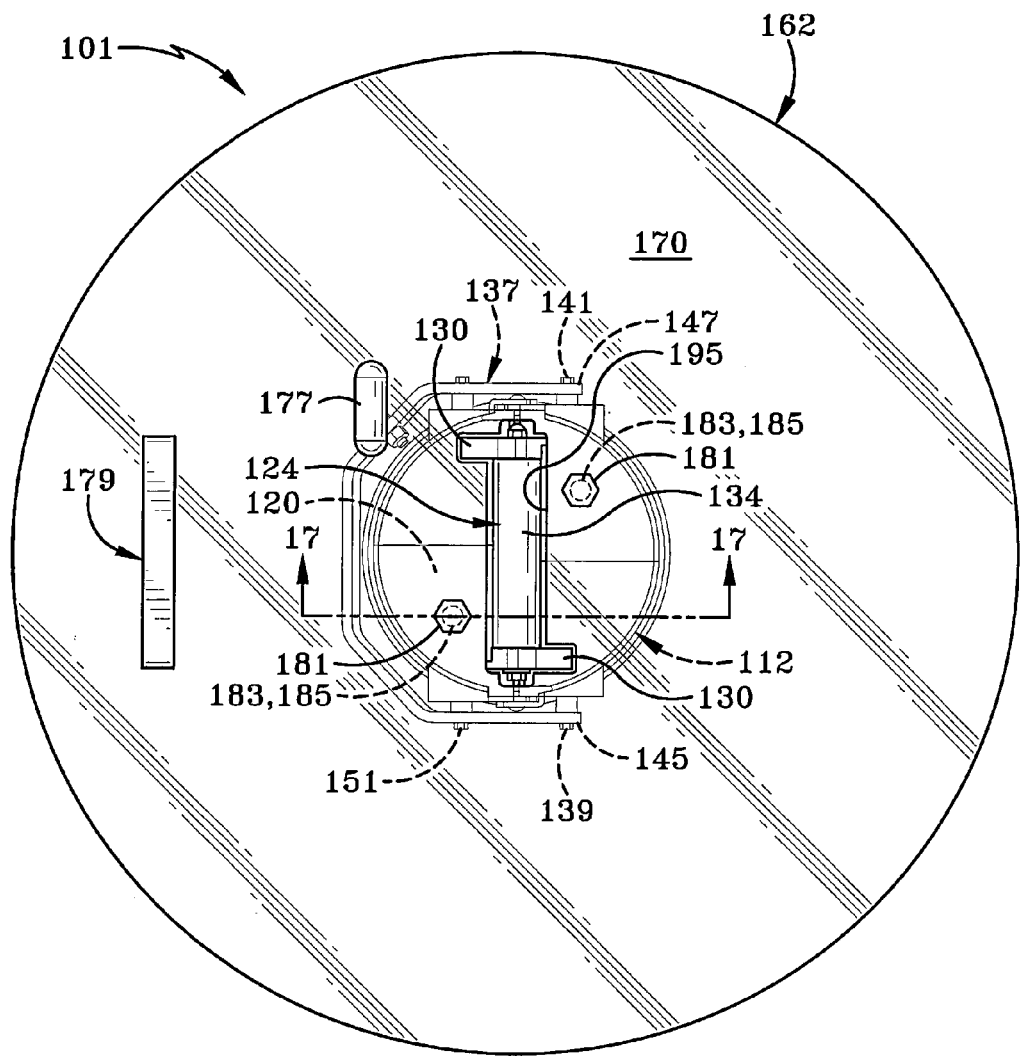
FIG. 16 is a top plan view of the enhanced meter puller.
Figure 18:
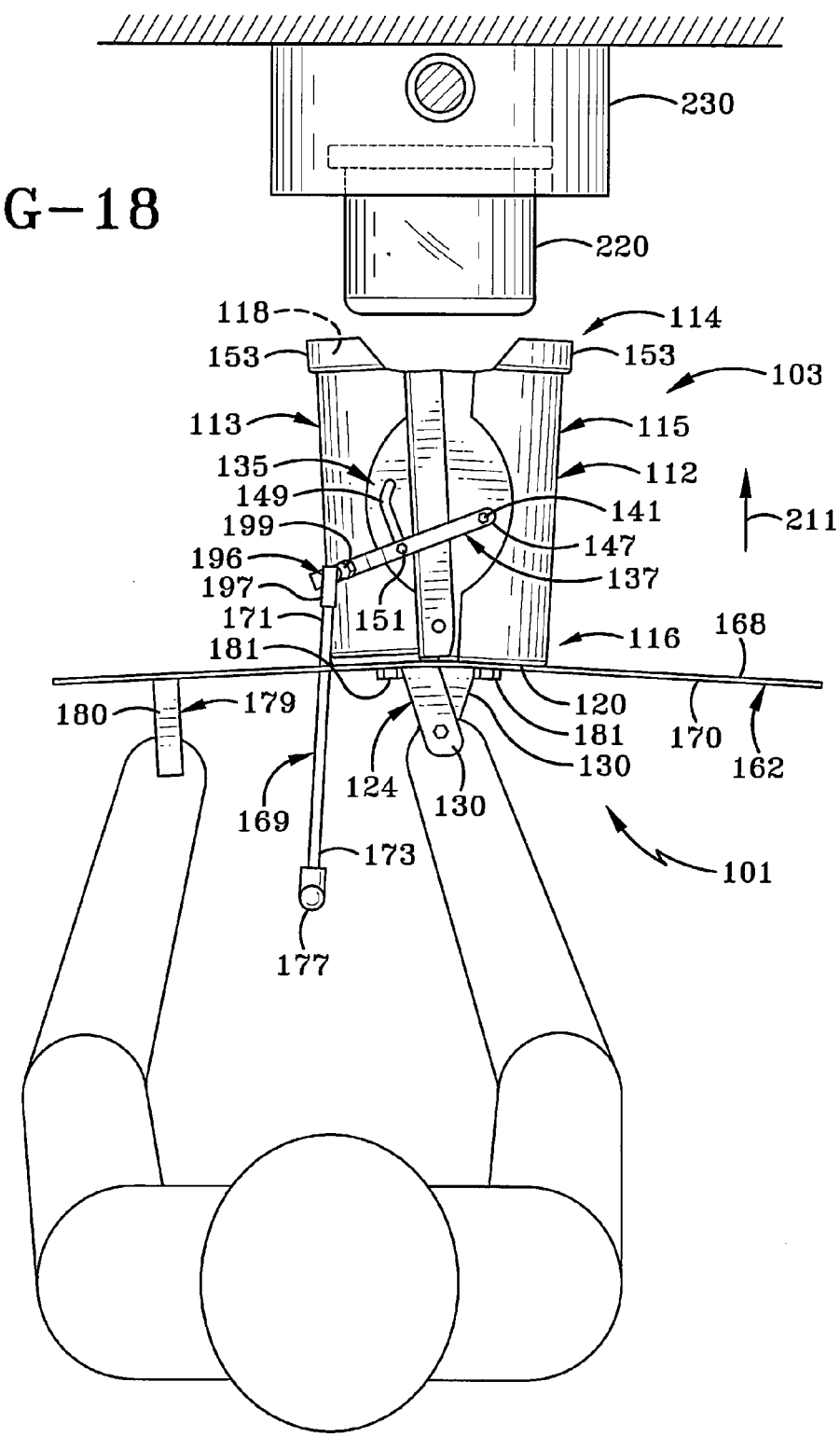
FIG. 18 is an operational view showing an operator gripping the handles of the enhanced meter puller and manually moving the enhanced meter puller towards a meter.

As shown in FIG. 10, meter puller 103 includes a locking mechanism or a clamping system, shown generally at 135. Clamping system 135 is intended to move first sleeve portion 113 and second sleeve portion 115 together and apart to clamp onto a meter for extraction. Clamping system 135 includes a cam arm 137 extending from a first end 145 to a second end 147. First end 145 is pivotably connected to second sleeve portion 115 by way of a pivot bolt 139, whereas second end 147 (FIG. 16) is pivotably connected to a distal portion of second sleeve portion 115 by way of a pivot bolt 141 (FIG. 16). Thus, cam arm 137 wraps entirely around first sleeve portion 113, and is pivotable from a first position (FIG. 10) to a second position (FIG. 18). A user generally actuates cam arm 137 by way of a knob 143 removably secured to cam arm 137 via a threaded member 144 (FIG. 11) extending into an aperture 146 (FIG. 11) defined by cam arm 137. Threaded member 144 is secured therein by way of a nut 148.

As shown in FIG. 10, clamping system 135 further includes a pair of cam tracks 149 defined by first sleeve portion 113. A corresponding pair of cam bolts 151 extend from cam arm 137 into cam tracks 149 to cammably connect first end 114 of sleeve member 112 to cam arm 137. It will readily be understood that by moving cam arm 137 from the first position to the second position, cam bolts 151 follow the orientation of cam tracks 149 in a camming manner to move first sleeve portion 113 in relation to second sleeve portion 115. This reduces the overall size of opening 118 when cam arm 137 is in the first position, and enlarges opening 118 when cam arm 137 is in the second position. Extending from each of first sleeve portion 113 and second sleeve portion 115 are a pair of corresponding lock lips 153, which generally surround opening 118. Those in the art will readily understand that cam arm 137 is moved from the second position to the first position to clamp lock lips 153 around a meter for extraction. Those in the art will readily understand that cam arm 137 is moved from the second position to the first position to clamp lock lips 153 around a meter for extraction. Pursuant to this, once lock lips 153 are clamped on a meter, the user then physically pulls meter puller 103 by way of handle 124 to remove the meter from the meter box.

Enhanced meter puller 101, the individual components, and the overall method for assembling the same will now be discussed. One of the primary features of enhanced meter puller 101 relates to applying a shield 162 to meter puller 103 for protecting the user. Pursuant to this, enhanced meter puller 101 provides a method for actuating clamping system 135 safely behind shield 162. Broadly speaking, shield 162 includes a first side 168 and an opposite second side 170. As shown in FIG. 14, first side 168 is sized and positioned to abut top surface 120 of sleeve member 112. A plurality of bolts 181 are provided and sized to fit through a corresponding plurality of bolt apertures 183 defined by shield 162 such that bolts 181 extend through the corresponding bolt apertures 183 and into sleeve member 112 to secure shield 162 thereto. As such, sleeve member 112 proximate second end 116 must provide a corresponding receiving hole 185 for receiving bolt 181 therein. Inasmuch as meter puller 103 may be provided as an off-the-shelf component, receiving holes 185 may not be provided at the outset. Thus, a template 165 is provided for ensuring receiving holes 185 align with bolt apertures 183.

Figure 12:
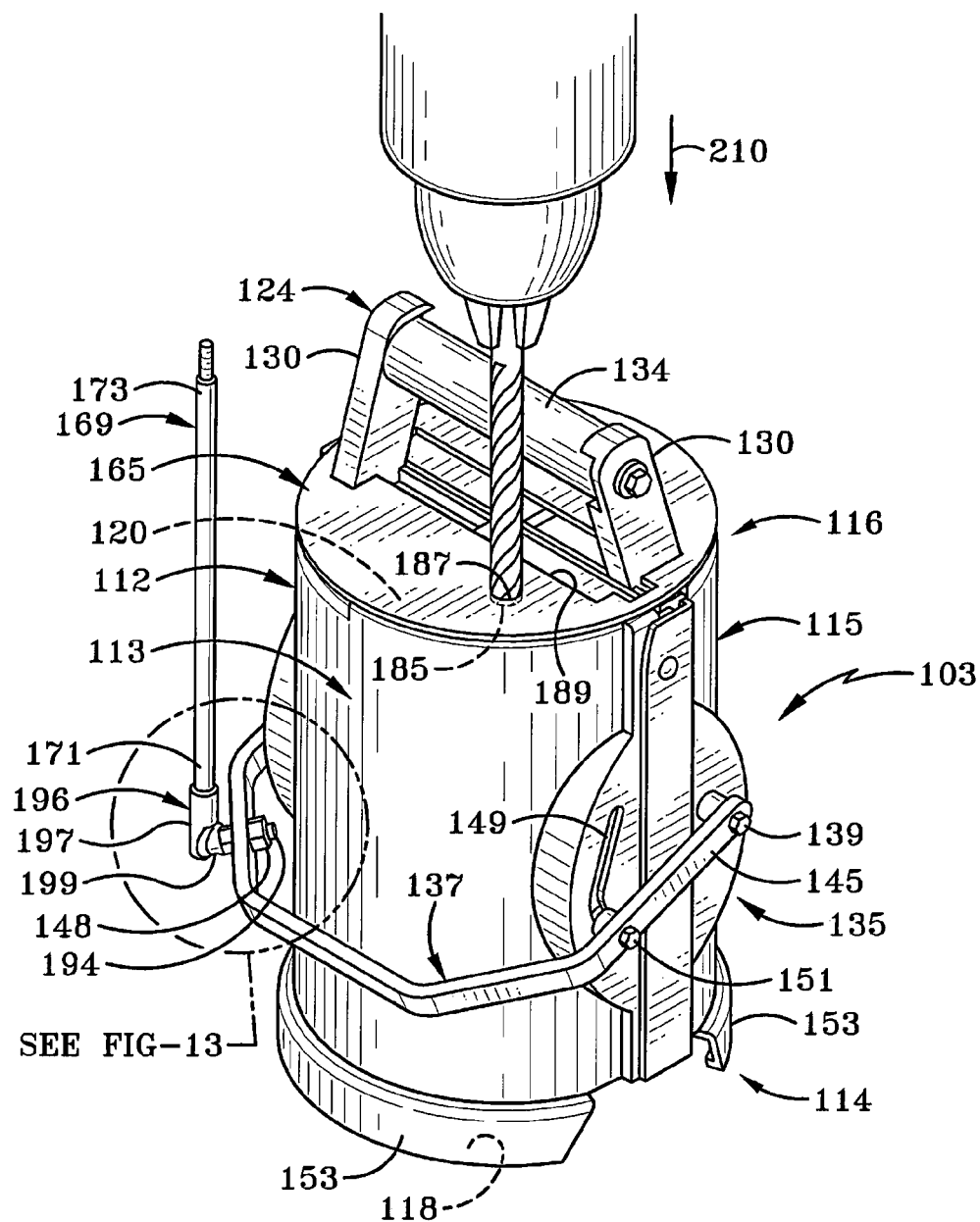
FIG. 12 is a perspective view of the sleeve member having a drill extending therein and an actuation device attached thereto.
Figure 15:
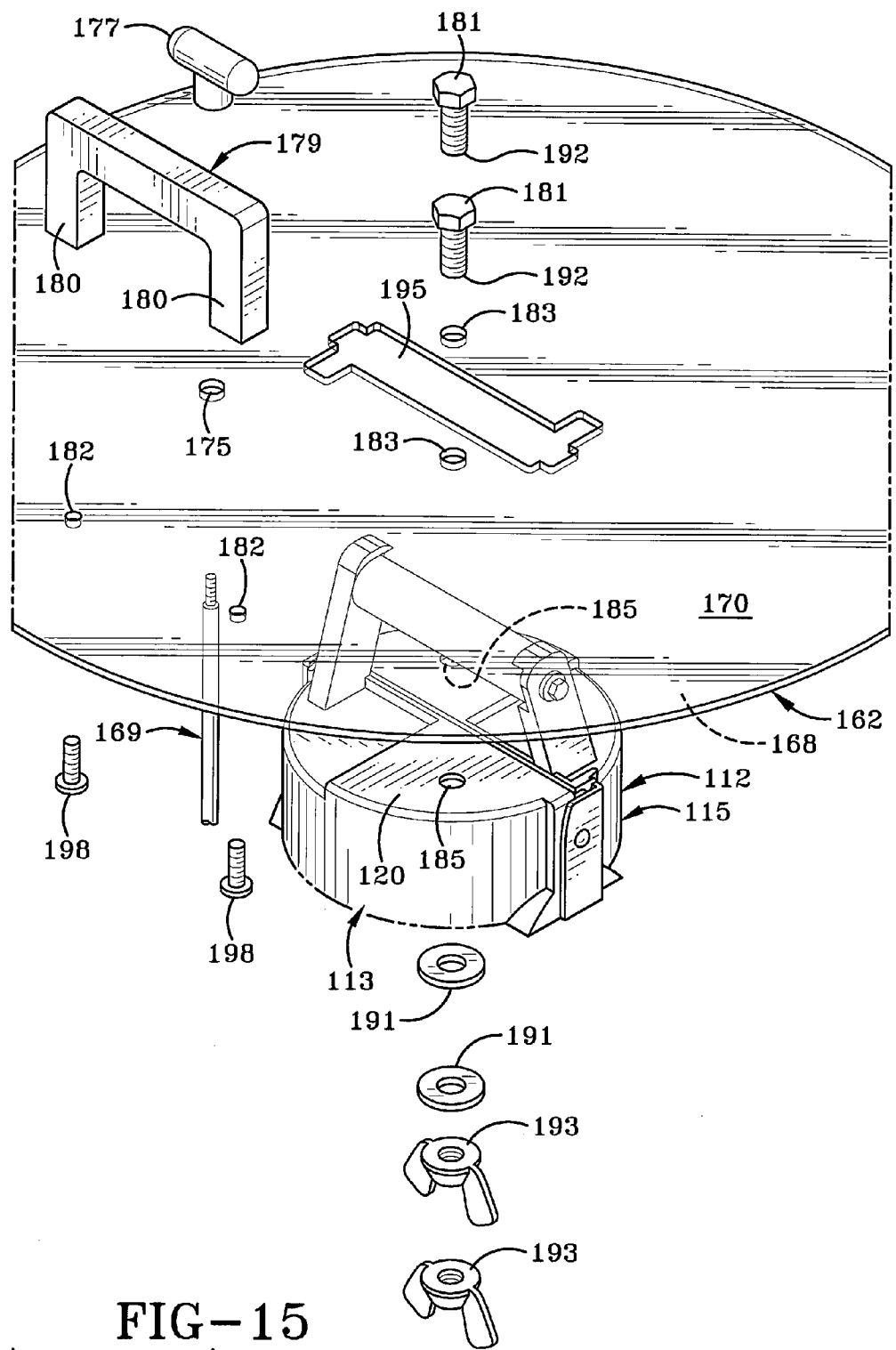
FIG. 15 is a partial exploded view of the enhanced meter puller of the present invention.
Figure 17:
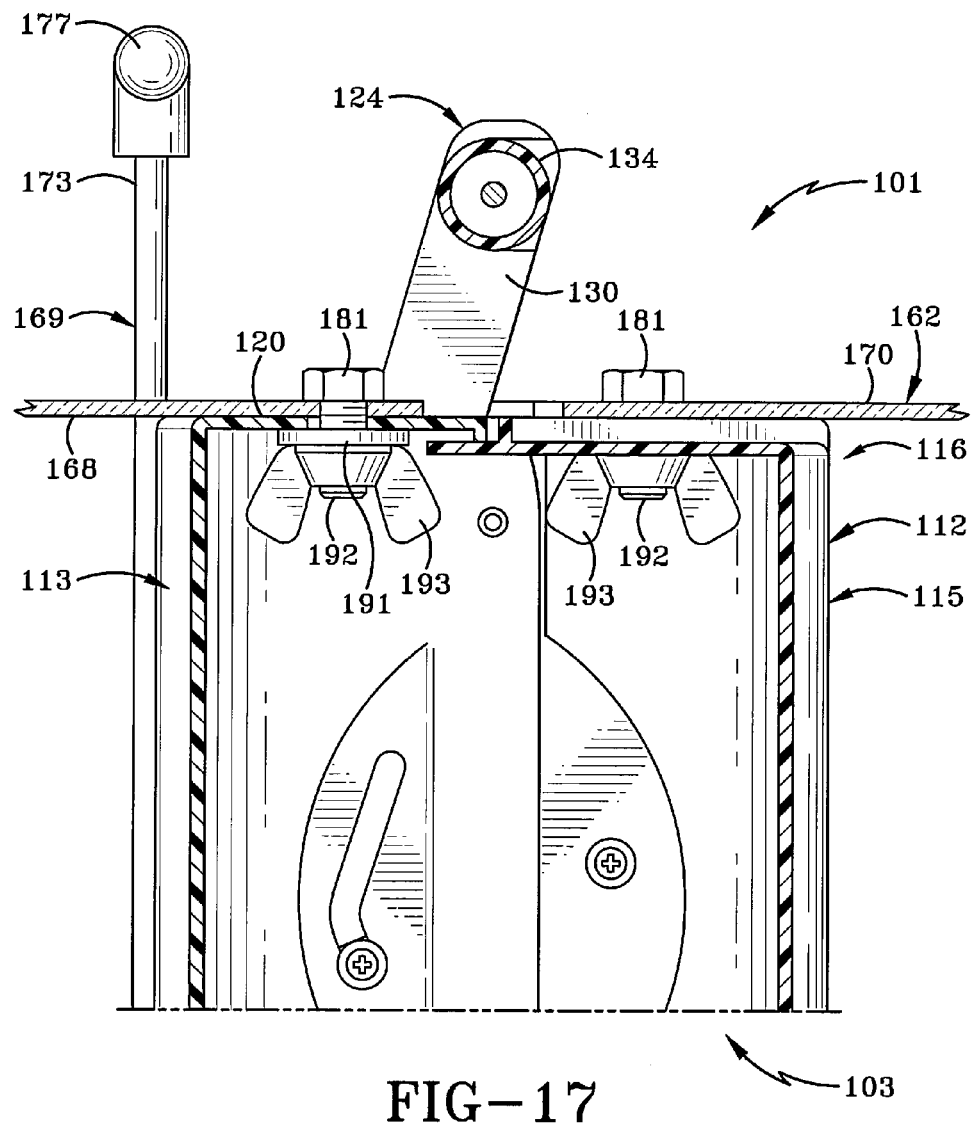
FIG. 17 is a partial cross-sectional view of the enhanced meter puller taken generally about Line 17-17 of FIG. 16.

Template 165 is provided with a plurality of drill apertures 187 as well as a handle aperture 189. As such, the user may extend template 165 onto second end 116 of sleeve member 112 such that template 165 abuts top surface 120. It will be readily understood that handle aperture 189 is sized and shaped to receive handle 124 therethrough for allowing template 165 to extend down into an abutting relationship with top surface 120. As shown in FIG. 12, the user then extends a drill through drill apertures 187 and into sleeve member 112 such that receiving holes 185 are formed thereby, and in correct alignment with bolt apertures 183. Thereafter, template 165 is removed and shield 162 is lowered onto top surface 120 such that bolt apertures 183 align with receiving holes 185, which allows the user to extend bolts 181 through both bolt apertures 183 and receiving holes 185. As shown in FIGS. 15 and 17, a free end 192 of each bolt 181 is thereby positioned within sleeve member 112 proximate second end 116. Thereafter, the user then applies a washer 191 and a wing nut 193 onto free end 192 to secure bolts 181 and lock shield 162 onto meter puller 103. As shown in FIG. 15, shield 162 further includes a handle aperture 195 which is particularly sized and shaped to align handle 124 to pass therethrough, thus allowing shield 162 to tightly abut top surface 120. One will readily understand that handle aperture 195, handle aperture 189, and other related components of enhanced meter puller 101 may be sized and shaped differently to accommodate different meter pullers 103 in general, and in particular, different second ends 116 of sleeve member 112.

As shown in FIG. 15, enhanced meter puller 101 further includes a brace handle 179 for providing additional handle for use by the user in manually pulling the enhanced meter puller 101, and physically manipulating the overall structure. Brace handle 179 is formed in an overall C-shaped structure having a pair of legs 180 which extend to align with a corresponding pair of handle apertures 182 defined by shield 162 and particularly positioned such that a corresponding pair of handle bolts 198 extend therethrough to secure brace handle 179 to shield 162, as shown in FIGS. 14 and 18. As such, brace handle 179 extends upwardly away from second side 170 of shield 162. Thus, the user enjoys both handle 124 as provided by meter puller 103, as well as brace handle 179 as provided by enhanced meter puller 101 for use in manually manipulating the overall structure of enhanced meter puller 101, particularly when clamping system 135 is clamped onto a meter.

Figure 11:
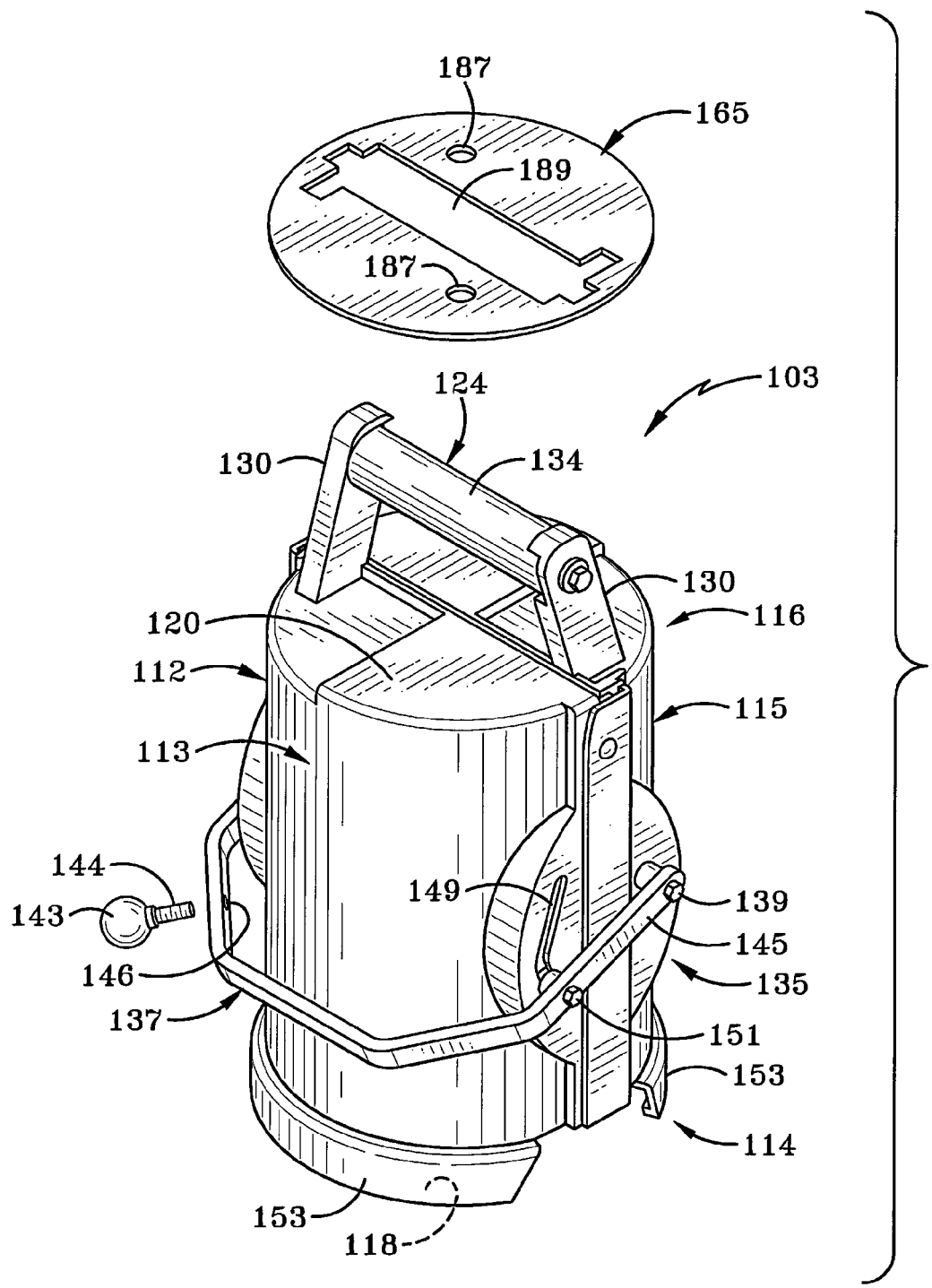
FIG. 11 is an exploded view of the sleeve member shown with a template.
Figure 13:
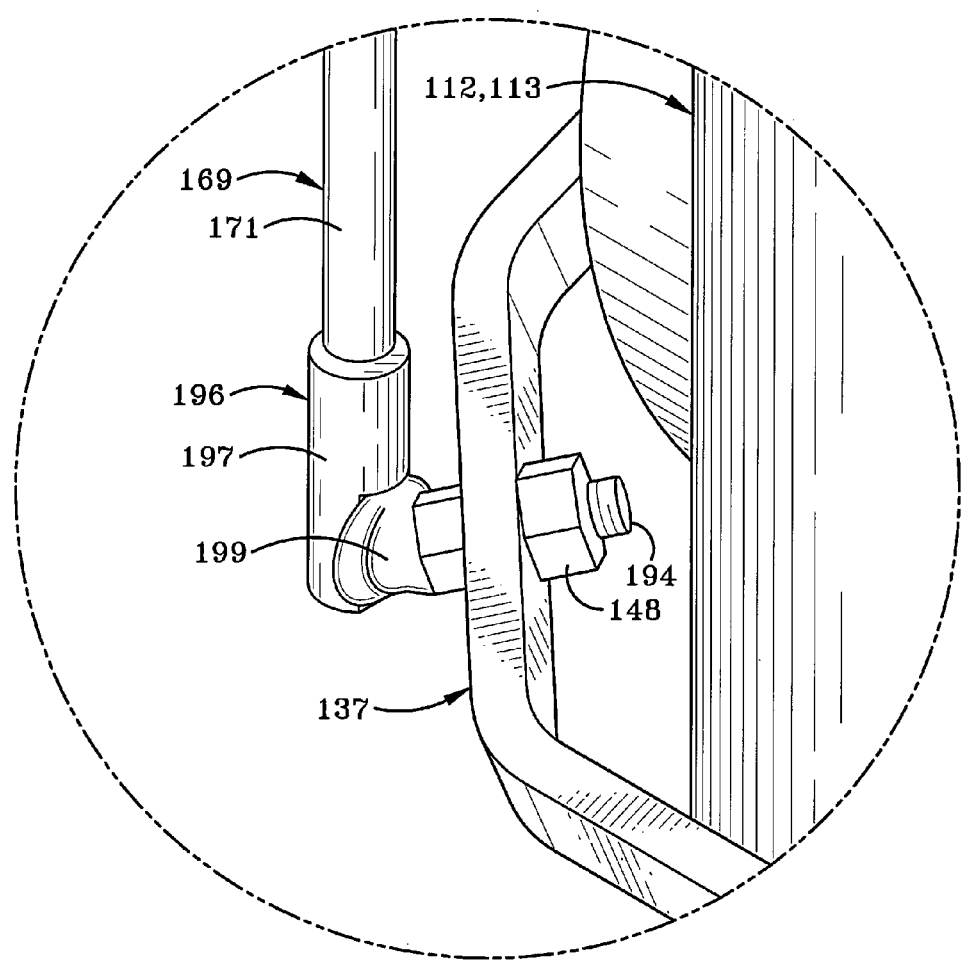
FIG. 13 is an enlarged view of a portion of FIG. 12.

It is a primary feature of the present invention that a user of enhanced meter puller 101 may actuate clamping system 135 from behind the relative safety of second side 170 of shield 162. Thus, the physical manipulation of enhanced meter puller 101, as well as the actuation of clamping system 135 may be done entirely behind shield 162. Pursuant to this, shield 162 defines aperture 175 which is positioned purposely to align an actuation device 169 with cam arm 137, as shown in FIG. 14. As shown in FIG. 12, actuation device 169 includes a first portion 171 and a second portion 173. As shown in FIG. 14, first portion 171 is sized and shaped to be extended through aperture 175 and disposed proximate cam arm 137. As shown in FIG. 13, a bracket 196 is provided to pivotally secure first portion 171 of actuation device 169 to cam arm 137. Bracket 196 includes a receiving sleeve 197 for receiving first portion 171 of actuation device 169 therein. Bracket 196 further includes a pivot element 199 for allowing receiving sleeve 197 to pivot while first portion 171 is secured therein. A shaft 194 extends from pivot element 199 and receiving sleeve 197, and is sized and shaped to extend through aperture 146 defined by cam arm 137 (FIG. 11). Thereafter, nut 148 or alternatively, an additional nut is secured to shaft 194 to firmly secure shaft 194 and the overall bracket 196 onto cam arm 137 in a pivotable manner. As shown in FIG. 14, second portion 173 of actuation device 169 thereafter extends through aperture 175 and outwardly away from second side 170 of shield 162 such that an actuation handle 177 may be applied thereon. In accordance with the pivoting nature of cam arm 137 and overall clamping system 135, the user may thereafter push and pull actuation handle 177 to move cam arm 137 between the first position (FIG. 19) and the second position (FIG. 18). Aperture 175 is sized to allow a reasonably tight fit around actuation device 169 such that the pushing and pulling on handle 177 generally in a linear nature towards and away from shield 162. One will readily recognize that manually manipulating handle 177 in a linear manner corresponds to manually manipulating cam arm 137 in a linear manner. However, manipulating actuation handle 177 is done from a safe position behind shield 162, thereby drastically reducing the chance that a user will be harmed by an explosion or an electrical discharge from the meter while the meter is being removed. This represents an enormous leap in the field in terms of safety as well as efficiency, as it will be readily understood that shield 162 may be retroactively applied to preexisting off-the-shelf meter pullers 103. Thus, the overall expense of providing the user with improved safety is relatively minor.

The overall size of shield 162 may differ, however, in the preferred embodiment, the overall diameter or cross-sectional size of shield 162 is preferably at least 50% larger than the overall diameter of second end 116 of sleeve member 112. This provides the user with an extended shielding while manually manipulating meter puller 103. Likewise, shield 162 may be manufactured using any common components. However, shield 162 is preferably constructed using a dielectric or insulating material such that electricity may be dissipated efficiently without harming the user.

A user may receive the elements for forming enhanced meter puller 101 as a kit or aftermarket addition for standard off-the-shelf meter pullers, similar to meter puller 103. Alternatively, it is within the scope of the invention to provide enhanced meter puller 101 in a fully assembled state, having the shield secured onto a sleeve member for sale as a single unit.

In operation, the user or assembler is presented with meter puller 103 and the elements for assembling enhanced meter puller 101 and begins forming enhanced meter puller 101 by abutting template 165 to top surface 120 of sleeve member 112. This allows the user to align drill apertures 187 on template 165 with the areas on top surface 120 for forming receiving holes 185. As shown in FIG. 12, the user drills through template 165 and drill apertures 187 into sleeve member 112 to form receiving holes 185 therein.

One will readily understand that the drilling is generally undertaken in the direction of Arrow 210 to penetrate through template 165 and into sleeve member 112. Thereafter, the user then removes knob 143 from cam arm 137 to expose aperture 146 for attachment with first portion 171 of actuation device 169. Shaft 194 on bracket 196 is extended through aperture 146 and secured therein by way of nut 148 or a similar element such that actuation device 169 is pivotable to move cam arm between the first position and the second position as desired by the user. As shown in FIG. 15, thereafter, the user then extends shield 162 such that handle 124 extends through aperture 195 allowing first side 168 of shield 162 to abut top surface 120 of sleeve member 112. Inasmuch as bolt apertures 183 and receiving holes 185 are aligned, free end 192 of bolts 181 extend through each of these openings and into the interior of sleeve member 112, where each free end 192 is secured by any means in the art. Particularly, as shown in FIG. 15, free end 192 is secured therein by washer 191 and wing nut 193 threadably received thereon. Concurrent to this, second portion 193 of actuation device 169 extends through aperture 175 to extend outwardly away from second side 170 of shield 162. The user then screws or adheres actuation handle 177 onto second portion 173 of actuation device 169. Thereafter, the user then secures brace handle 179 to shield 162 by way of handle bolts 198 extending through handle apertures 182 and into each of the pair of legs 180. Thus, enhanced meter puller 101 is shown in the fully assembled state in FIG. 14.

Figure 19:
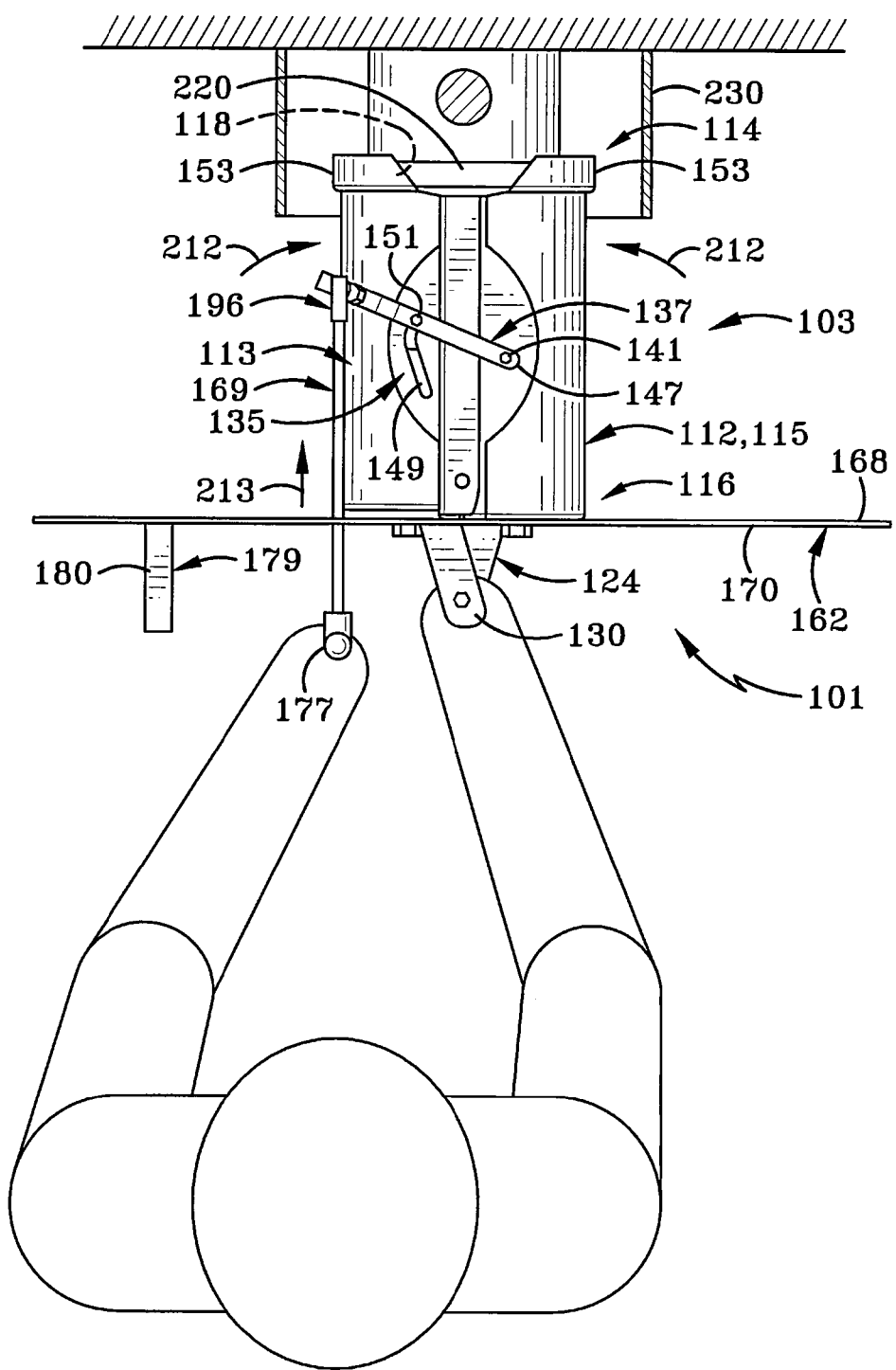
FIG. 19 is an operational view showing an operator actuating a clamping system of the meter puller from behind the shield.
Figure 20:
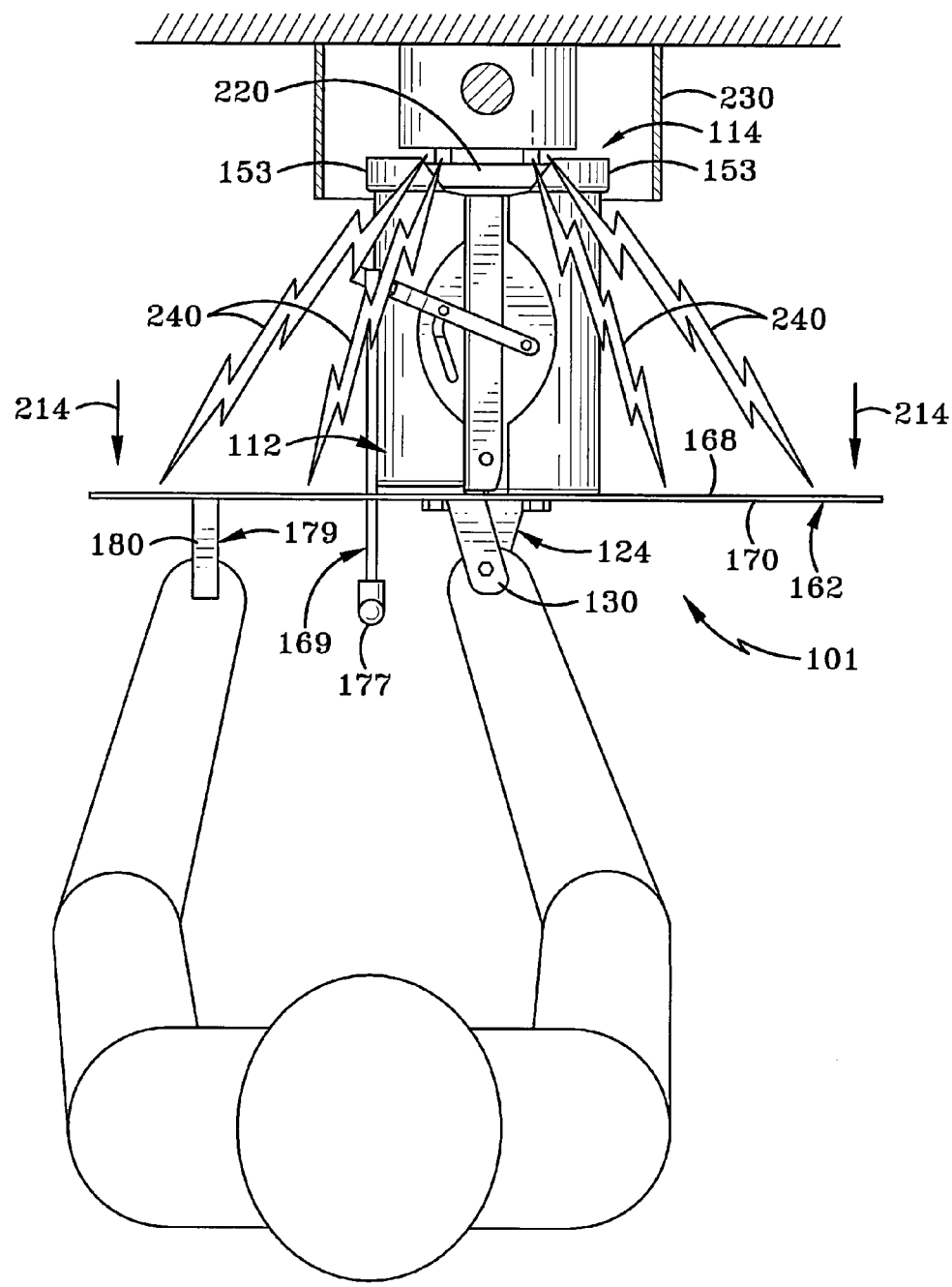
FIG. 20 is an operational view of the operator removing the meter using the enhanced meter puller and an electrical explosion being deflected around the shield.

As shown in FIGS. 18-20, enhanced meter puller 101 is then useable to provide a safe method for removing a meter 220 disposed in an electrical box 230. As shown in FIG. 18, the method for removing a meter 220 from an electrical box 230 is shown in the initial stages. Meter 220 is interconnected with electrical box 230, and is in need of removal. To initiate removing meter 220, the user ensures that meter puller 103 is in the second or opened position. This requires cam arm 137 to be fully retracted towards the user with cam bolts 151 closest to the user. In this orientation, lock lips 153 are in a fully opened and extended position with opening 118 having its largest diameter. As one can readily ascertain from viewing FIG. 18, the user is positioned behind shield 162 such that shield 162 is intermediate the user and the meter 220. The user then moves enhanced meter puller 101 in the direction of Arrow 211 to plunge meter 220 into the interior of sleeve member 112. As shown in FIG. 19, the user then pushes actuation handle 177 towards meter 220 to articulate actuation device 169 such that cam arm 137 moves forward or away from the user to transition meter puller 103 into the first or closed position. Likewise, this movement of cam arm 137 retracts lock lips 153 in the directions of arrow 211 to lock puller 103 onto meter 220. Clamping system 135 is engaged and moved by the user safely behind shield 162. Therefore, any electrical discharge or explosion will be deflected by shield 162 away from and around the user.

As shown in FIG. 20, after the user locks meter puller 103 onto meter 220 by actuating clamping system 135 from safely behind shield 162, the user then grasps enhanced meter puller 101 by handle 124 and brace handle 179 to allow the user to manually manipulate and pull enhanced meter puller 101 in the direction of Arrows 214 to thereby remove meter 220 from electrical box 230. As shown in FIG. 20, in the event there is an electronic discharge or explosion 240, the user remains safely behind shield 162 and proximate second side 170 throughout the entire operation of using enhanced meter puller 101 to remove meter 220 from electrical box 230.

Figure 21:
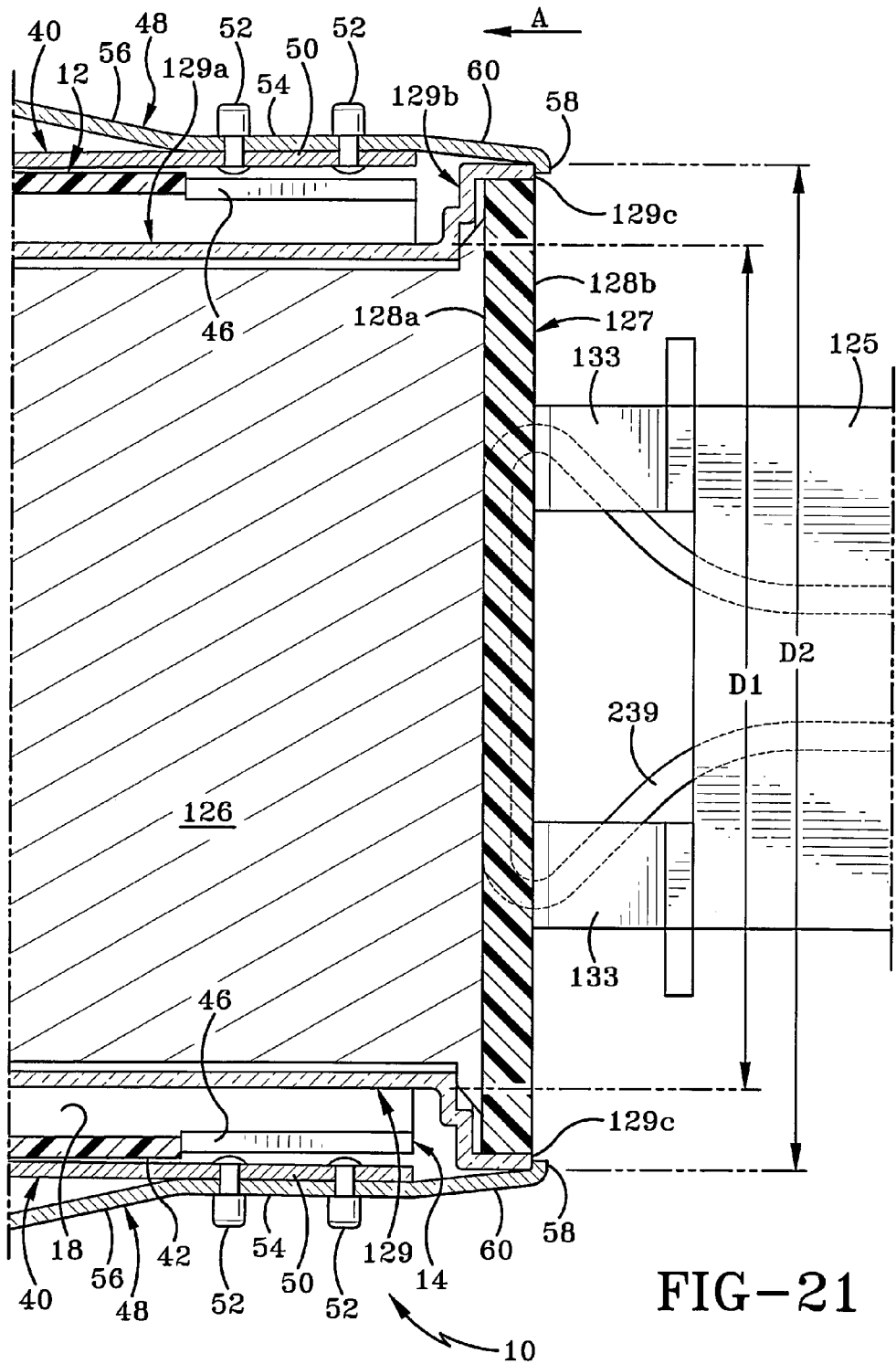
FIG. 21 is a partial cross-sectional side view of the first embodiment meter puller engaged with a meter and showing the hook portions of the meter puller engaging the terminal end of the dome.

FIG. 21 shows a cross-sectional view of sleeve member 12 of meter puller 10, previously described herein, engaged with electrical power meter 126. Meter 126 includes a base 127 and a glass dome 129. Dome 129 comprises a first region 129a which is generally circular in cross-sectional shape and is of a first diameter "D1". Dome 129 further comprises a second region 129b which is coaxial with first region 129a but comprises a bezel or rim region which is stepped and is of a larger diameter than first region 129a. In particular, the second region 129b has a maximum diameter "D2" which is substantially equal to that of base 127. The bezel or second region 129b circumscribes and engages base 127. The terminal end 129c of dome 129 comprises part of this second region 129b and terminates substantially flush with back surface 128b of base 127. First region 129a of dome 129 extends forward and outwardly away from a front surface 128a of base 127. Back surface 128b of base 127 is interlockingly engaged with stabs mounts 133 which extend outwardly from meter mount 125 as is well known in the art. The uppermost pair of stabs mounts are energized stabs mounts while the bottom pair of stabs mounts are neutral stabs mounts. Additionally, bracing members 239 engage portions of the peripheral edge 128c of base 127 to retain meter 126 on meter mount 125.

FIG. 21 shows sleeve 12 of meter puller 10 engaged with meter 126. In particular, this figure shows lower angled portion 60 of hooks 40 overlapping second region 129b of dome 129. Hook portions 58 of lower angled portions 60 overlap terminal end 129c of dome 129. Because of this overlapping engagement, when meter puller 10 is moved in the direction of arrow "A" away from meter mount 125, hooks 58 will move in the direction of arrow "A" and will pull meter 126 off meter mount 125. This system works effectively provided that substantially the entire dome 129 and most particularly the second region 129b thereof is intact. However, it is fairly common that some part of dome 129, particularly second region 129b thereof is cracked or broken. When this occurs, it is extremely difficult for meter puller 10 to engage meter 126 to a degree sufficiently secure enough to be able to pull dome 129 and base 127 off meter mount 125.

Figure 22:
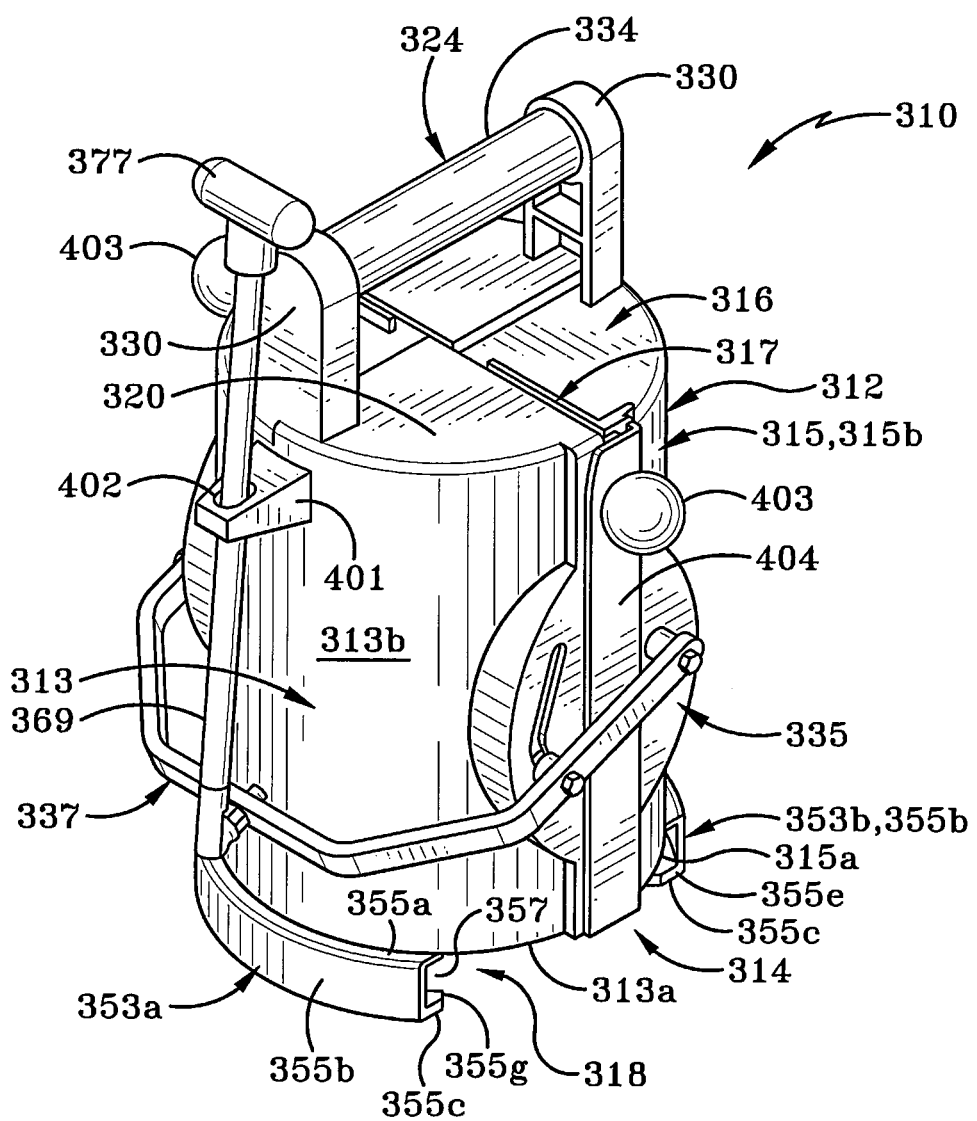
FIG. 22 is perspective view of a third embodiment of a meter puller in accordance with the present invention.

In order to address this issue, there is shown in FIGS. 22-28, a third embodiment of a meter puller in accordance with the present invention, generally indicated at 310. Meter puller 310 is illustrated in FIG. 22 without the presence of a shield 62 or 162 but it should be understood that a shield in accordance with the present invention could be engaged with meter puller 310 in the manner described previously herein.

Meter puller 310 is substantially similar to meter puller 103 in that it includes a sleeve member 312 comprised of a first sleeve portion 313 and a second sleeve portion 315, and has a first end 314 and a second end 316. In one embodiment of the device, meter puller 310 may be manufactured from a transparent material so that the operator is able to more accurately determine whether meter puller 310 is correctly positioned to capture meter 326 therein.

Figure 25:
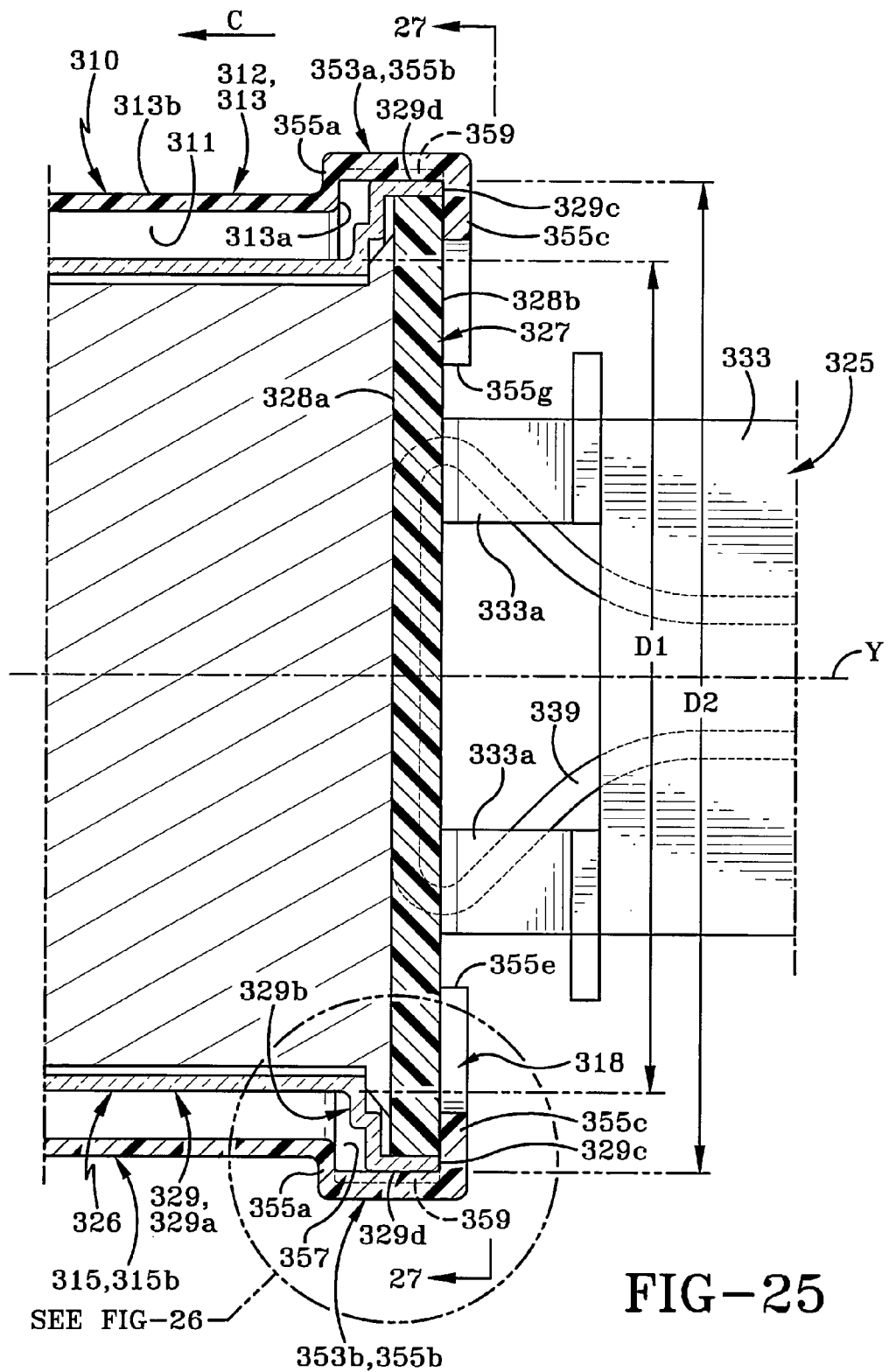
FIG. 25 is cross-sectional side view of the meter puller engaged with the meter and taken along line 25-25 of FIG. 24.

As with the second embodiment, first and second sleeve portions 313, 315 are movable relative to each other. First and second sleeve portions 313, 315 also bound and define an interior cavity 311 (FIG. 25). First end 314 defines an opening 318 to cavity 311. Second end 316 includes a top surface 320 from which a pair of handle posts 330 extends outwardly. A central handle shaft 334 extends between the handle posts 330 to form a handle 324. A projection (not shown) extends out of each end of handle shaft 334 and each projection is received within a channel in one of handle posts 330. This configuration enables handle shaft 324 to slide a bit back and forth between posts 330 as first and second sleeve portions 313, 315 are moved toward and away from each other. The configuration of the handle 324 also substantially prevents handle shaft 334 from rotating inside handle posts 330 and about its longitudinal axis. This handle design ensures that the operator is able to securely hold meter puller 310 during operation of the same and thus improves the safety of installing or removing meter 326.

It should be noted that in the second embodiment of the meter puller 103, central shaft 134 of handle 124 is substantially vertically aligned with a zone 117 (FIG. 10) along which the first and second sleeve portions 113, 115 join each other in top surface 120. In meter puller 310, on the other hand, central handle shaft 334 is disposed substantially at right angels to the zone 317 along which first and second sleeve portions 313, 315 join each other in top surface 320. Thus, when first and second sleeve portions 313, 315 move relative to each other as the device is used, their relative movement is substantially at right angles to the central handle shaft 334 of handle 324. This configuration of handle 324 and first and second sleeve portions 313, 315 makes it easier and therefore safer for the operator to move first and second sleeve portions 313, 315 toward and away from each other with the actuator rod 369, as will be hereinafter described.

Figure 23:
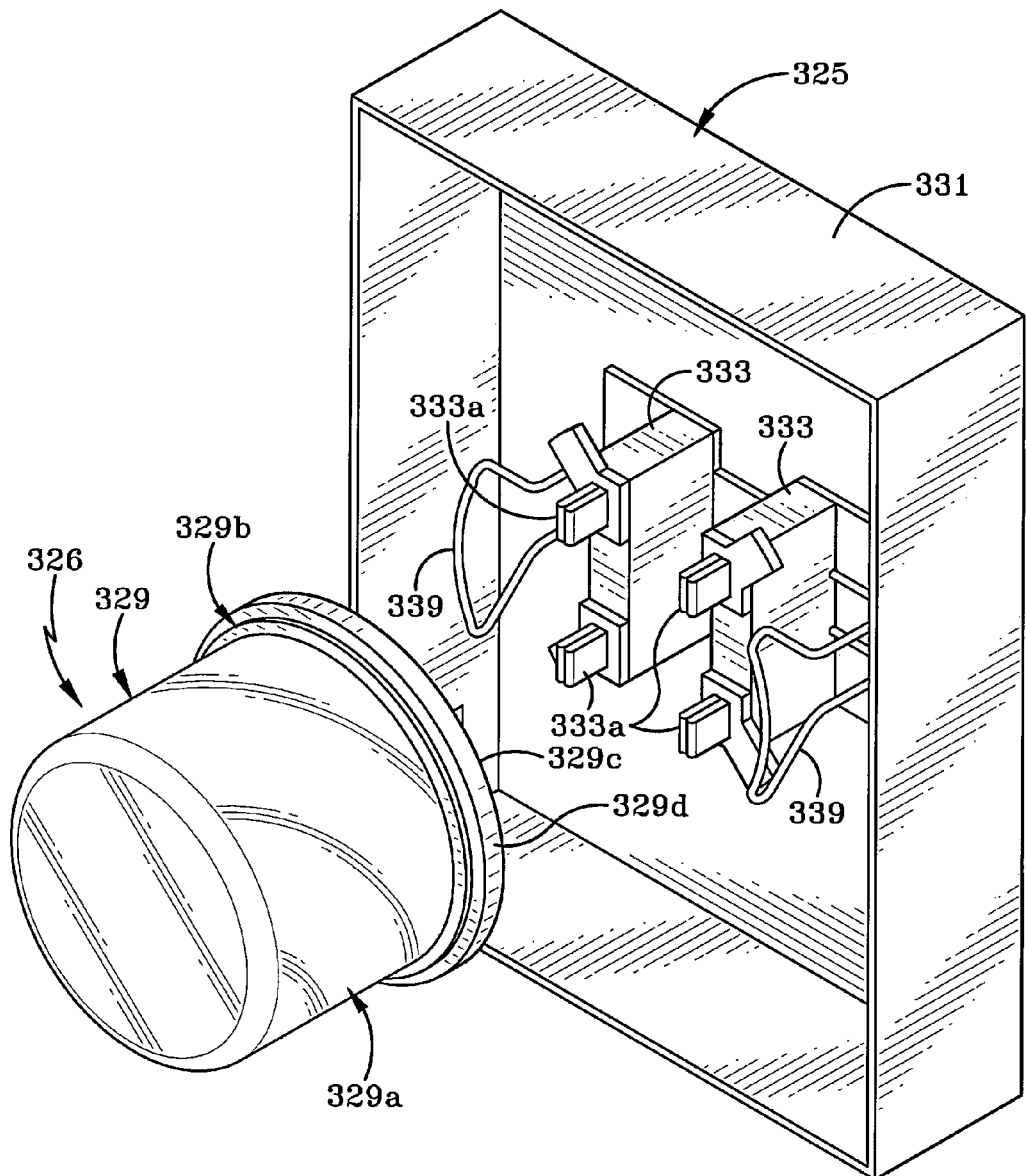
FIG. 23 is a perspective view of an electrical power meter exploded outwardly from a meter mounting box.
Figure 24:
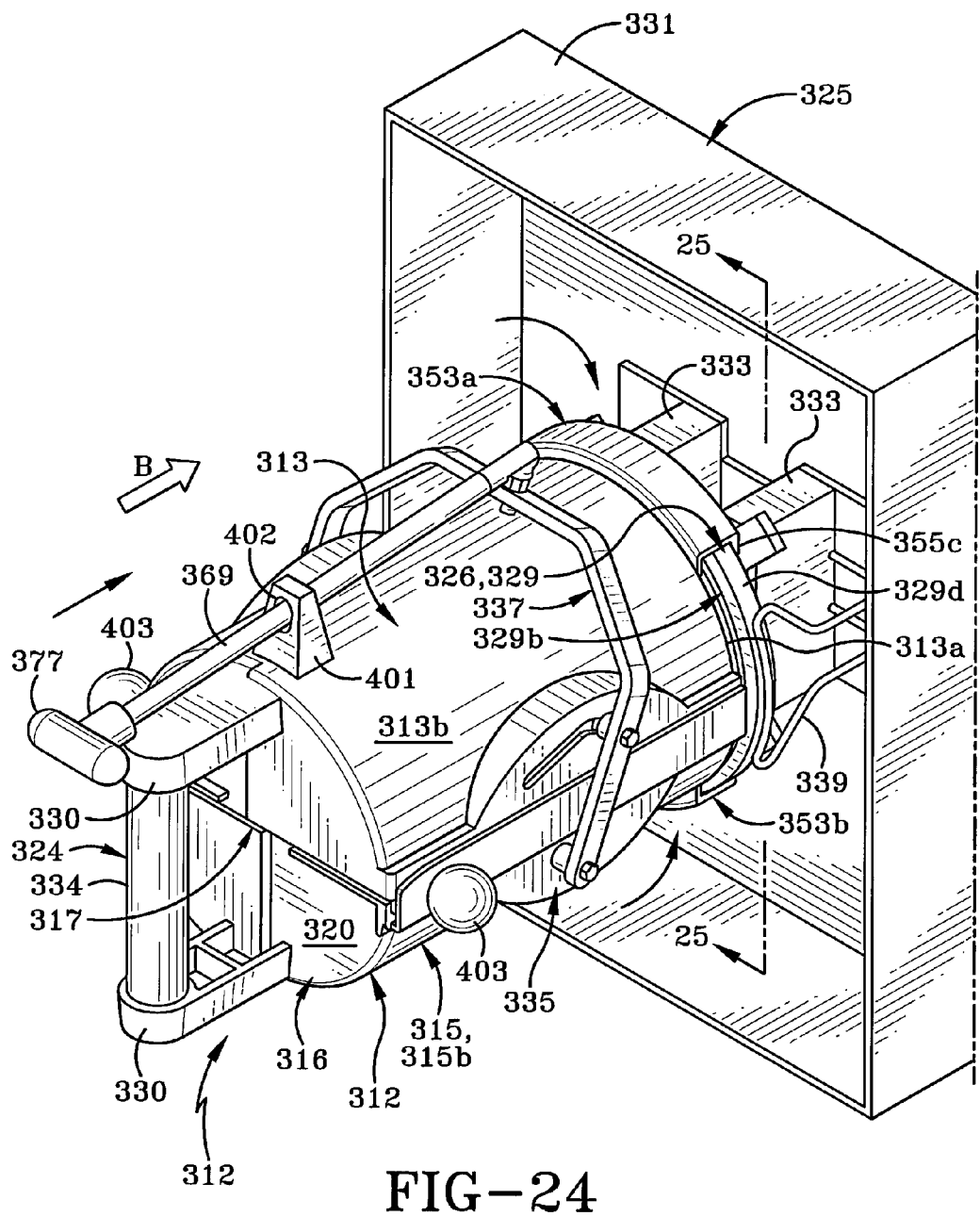
FIG. 24 is a perspective view of the third embodiment of the meter puller of the present invention being interlockingly engaged with the meter when mounted in the meter mounting box.

In accordance with the present invention, meter puller 310 also includes a clamping system, shown generally at 335. Clamping system 335 is substantially identical to clamping system 135 and will therefore not be described in greater detail herein. Suffice to say that clamping system 335 is configured to move first sleeve portion 313 and second sleeve portion 315 toward and away from each other in substantially the same manner as clamping system 135 moves first and second sleeve portions 113, 115 toward and away from each other. Clamping system 335 is operable in a first instance to cause first and second sleeve portions 313, 315 to move away from each other to enlarge opening 318 so that the device is able to clamp onto an electrical power meter 326 (FIG. 23). Clamping system 335 is operable in a second instance to cause first and second sleeve portions 313, 315 to move toward each other to reduce the size of opening 318 and so that the device will clampingly engage electrical power meter 326, as will be hereinafter described.

Clamping system 335 differs from clamping system 135 in that the cam arm 337 which forms part thereof differs somewhat from cam arm 137. Cam arm 337 has a first end 345 which is similarly configured to first end 145 and a second end 347 which is similarly configured to second end 147 (FIG. 10). Instead of a knob 143 being disposed intermediate first and second ends 145, 147, cam arm 337 includes the actuator rod 369 which is permanently engaged with an actuator guide 401 extending outwardly from a side wall 313b of first sleeve 313. Actuator guide 401 is disposed proximate second end 316 of sleeve member 312 and defines a guide hole 402 therein. Actuator rod 369 is engaged with cam arm 337 at a first end in the same manner that actuation device 169 is engaged with cam arm 137. Actuator rod 369 is provided with an actuator handle 377 at a second end. It should be noted that handle 377 is spaced a substantial distance away from top surface 320 of meter puller 310. The positioning of handle 377 makes it safer for an operator to actuate meter puller 310. Actuator rod 369 which extends from handle 377 functions in much the same way as actuation device 169 except that its movement is more precisely controlled by actuator guide 401 and that movement is therefore always substantially linear and substantially parallel to the longitudinal axis "Y" (FIG. 25) of meter puller 310. Substantially the entire rest of the structure of actuator rod 369 is the same as actuation device 169 and it functions in substantially the same manner as actuation device 169.

Meter pullers 103 and 310 provide an advantage over previously known meter pullers because of the camming action of clamping system 335 which is utilized to move first and second sleeve portions 313, 315 toward and away from each other. Previously known meter pullers are only capable of loosely grabbing a meter and it is necessary for the operator to maintain pressure on the handle at all times to keep the meter engaged with these previously known meter pullers. This makes the installation and retrieval of meters using previously known meter pullers a fairly exacting and potentially dangerous task. In the device of the present invention, on the other hand, camming action provided by clamping system 335 effectively locks the first and second sleeve portions 313, 315 in the closed position around the meter 326 (FIG. 22). This means that the meter 326 is securely retained within meter puller 310 during installation and retrieval thereof without the operator having to apply continued pressure on the handle to keep the puller locked. The present meter puller 310 is therefore an improvement over previously known devices because it tends to make the meter puller 310 more steady and stable during use and therefore safer for the operator.

Meter puller 310 further differs from meter puller 103 in that it is provided with a handle 403 on the actuation bracket 404 (FIG. 22) which extends vertically along the side edges between first and second sleeve portions 313, 315. Handle 403 is provided to aid the operator in holding meter puller 310 along with handle 324 in certain circumstances, as will be described later herein.

Meter puller 310 is designed to be able to pull electric meter 326 (FIG. 23) from its engagement with meter mount 325. Meter 326 includes a generally planar base 327 and a dome 329 which is engaged with the same as illustrated in FIGS. 23 and 25. Dome 329 is substantially identical to dome 129 and includes a first region 329a of a first diameter "D1", a second region 329b which is stepped and has a maximum diameter "D2", and a terminal end 329c which is flush with a rear surface 328b of base 327. Dome 329 further includes an annular side region 329d which comprises the outermost portion of second region 329b which is of the maximum diameter "D2". (The components housed within meter 326 are not illustrated herein for sake of clarity.) Meter 326 also has longitudinal axis "Y" which is disposed at right angles to base 327.

As shown in FIGS. 23 and 25, meter mount 325 includes a weatherproof housing 331 which surrounds and protects a grounded back plate from which extend an upper pair of energized stabs mounts and a lower pair of neutral stabs mounts 333. Stabs 333a (FIG. 23) extending outwardly from the energized and neutral stabs mounts 333 are configured to be received through apertures 341 (FIG. 27) in base 327 of meter 326. The pairs of stabs mounts 333 are substantially horizontally aligned with each other and a pair of generally Y-shaped bracing members 339 extends forwardly from the back wall of housing 331. Bracing members 339 are typically horizontally aligned with stabs mounts 333 and the pair of bracing members 339 flank the stabs mounts 333. Each gripping member 339 comprises a spring-loaded wireform that is configured to brace a section of the side region 329d of meter 326. When bracing members 339 are so engaged with side region 329d, meter 326 is tightly retained on meter mount 325. It is the clamping engagement of bracing members 339 with meter 326 that has to be overcome by meter puller 310.

Figure 27:
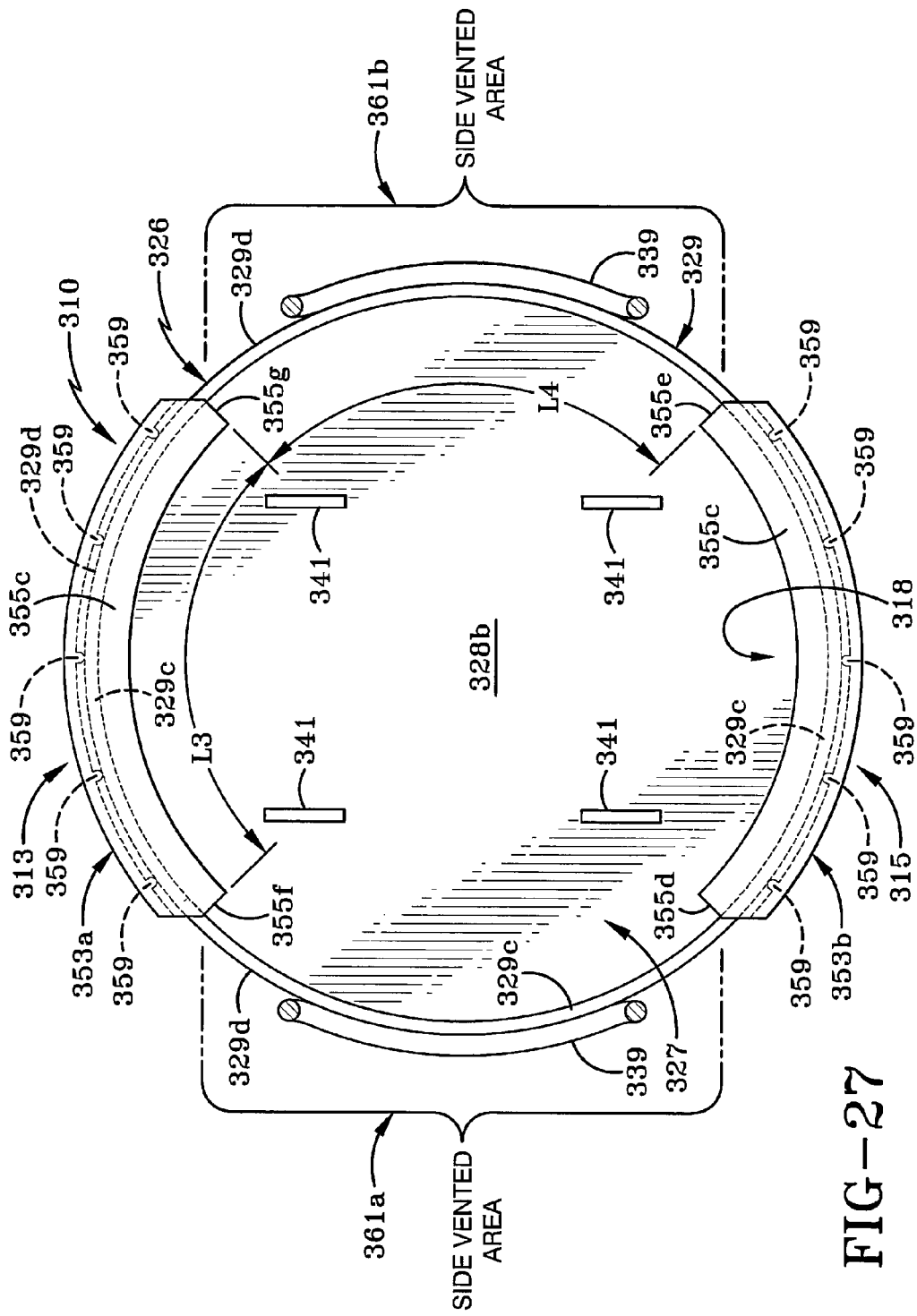
FIG. 27 is a rear view of the meter puller and meter taken along line 27-27 of FIG. 26.

In accordance with yet another feature of the present invention, meter puller 310 is provided with a pair of locking lips 353a, 353b. The location of locking lips 353a, 353b is best seen in FIGS. 22 and 27. First sleeve portion 313 has longitudinal side edges (not shown) which are disposed adjacent longitudinal side edges (not shown) of second sleeve portion 315. First sleeve portion 313 further has an end 313a which extends between the longitudinal side edges of first sleeve portion 313. Second sleeve portion 315 also has an end 315a which extends between the longitudinal side edges of second sleeve portion 315. The first end 313a of first sleeve portion 313 and the first end 315a of second sleeve portion 315 form a generally circular shape when sleeve member 312 is in the closed position, i.e. when first and second sleeve portions 313, 315 are disposed adjacent each other such as when they are clampingly engaged with meter 326 (shown in FIG. 27). This generally circular shaped end comprises the first end 314 of sleeve member 312. First end 314, because it is generally circular, has a circumference.

In accordance with the present invention, first locking lip 353a extends longitudinally outwardly away from end 313a of first sleeve portion 313 and second locking lip 353b extends longitudinally outwardly away from end 315a of second sleeve portion 315. Each of the first and second locking lips 353a, 353b are generally C-shaped when meter puller 310 is viewed from the back (such as in FIG. 27) and are disposed along portions of the circumference of sleeve member 312. Each of the first and second locking lips 353a, 353b is also generally U-shaped when viewed in cross-section (such as in FIGS. 25 & 26). First and second locking lips 353a, 353b are mirror images of each other and substantially identical in structure and function. Consequently, second locking lip 353b is described herein in greater detail but it will be understood that the description applies equally to first locking lip 353a.

Figure 26:
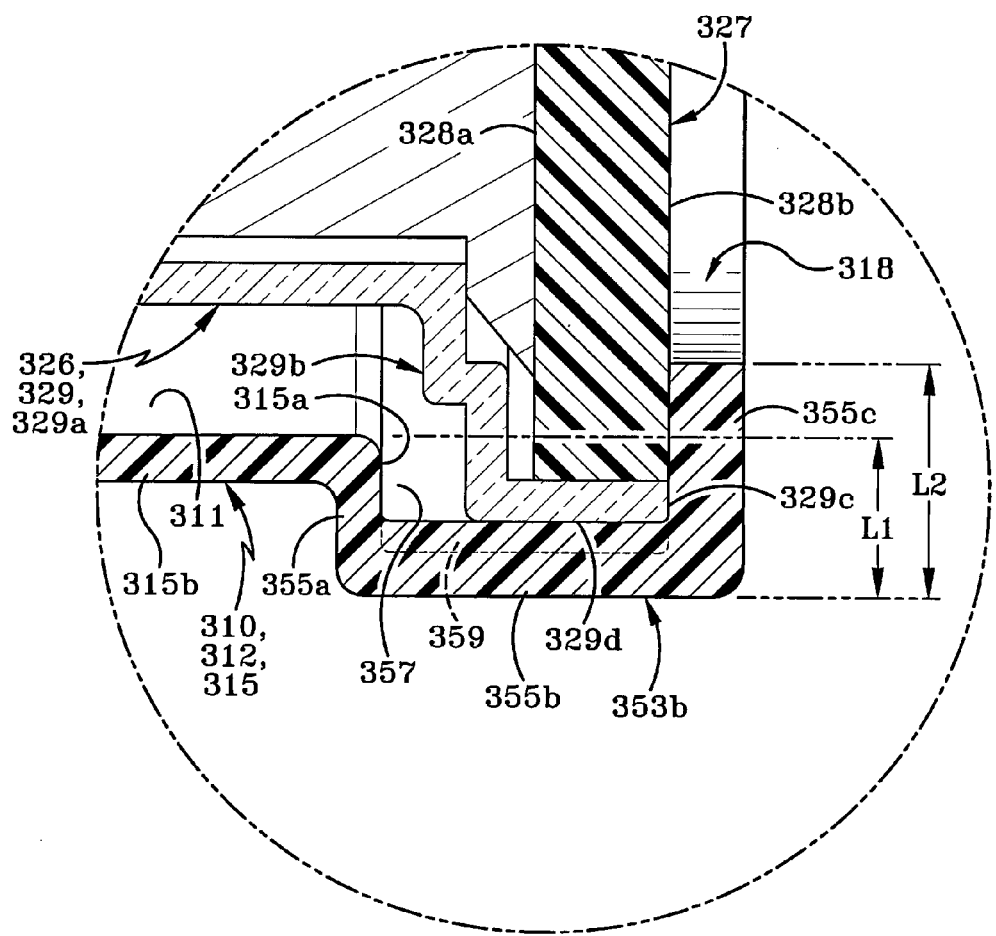
FIG. 26 is an enlarged cross-sectional side view of the highlighted region of FIG. 25.

Referring to FIG. 26, second locking lip 353a includes a first leg 355a, a second leg 355b, and a third leg 355c. First leg 355a extends outwardly from end 315a of second sleeve portion 315. Preferably, first leg 355a is integrally formed with the second sleeve portion 315 but it may, alternatively, be separately securable thereto. First leg 355a extends radially outwardly from side wall 315b of second sleeve portion 315 and is disposed substantially at right angles relative thereto. Second leg 355b extends outwardly from first leg 355a and is disposed substantially at right angles thereto. Third leg 355c extends outwardly from second leg 355b and is disposed substantially at right angles thereto. Thus, second leg 355b is substantially parallel to side wall 315b of second sleeve portion 315. Additionally, first and third legs 355a, 355c are substantially parallel to each other and extend outwardly from second leg 355b in generally the same direction as each other. A channel 357 is defined between first and third legs 355a, 355c and this channel 357 is sufficiently large enough to receive a circumferential portion of the second region 329b of meter dome 329 therein.

As is evident from FIG. 26, first leg 355a is of a first length "L1" and third leg 355c is of a second length "L2", and the second length "L2" is substantially longer than the first length "L1". In particular, third leg 355c is of a sufficient length that it extends beyond an interior surface of side wall 315b (FIG. 26) for a distance. Thus, third leg 355c extends for a distance across an opening to cavity 311, where the opening is defined between the ends 315a and 313a (FIG. 25) of first and second sleeve portions 313, 315. Preferably, second length "L2" is around ⅝ inches long. This second length "L2" of third leg 355c is sufficient to ensure that when meter puller 310 is engaged with meter 326, as will be hereinafter described, that third leg 355c will overlap a region of base 327 as well as covering the terminal end 329c of dome 329.

Second locking lip 353b further includes a plurality of strengthening ribs 359 (FIGS. 26 and 27) which extend between first and third legs 355a, 355c. Ribs 359 are spaced at intervals between the first and second side edges 355d, 355e of second locking lip 353b. Ribs 359 substantially prevent third leg 355c from being deflected outwardly away from first leg 355a when meter puller 310 is used to extract meter 326 and thereby from becoming damaged or failing during this operation.

FIG. 27 also shows that first and second side edges 355d, 355e of second locking lip 355 are generally V-shaped when viewed from the back. A first circumferential region 361a of sleeve member 312 is defined between first side edge 355d of second locking lip 353b and first side edge 355f of first locking lip 353a; and a second circumferential region 361b of sleeve member 312 is defined between second side edge 355e of second locking lip 353b and second side edge 355g of first locking lip 353a. These circumferential regions 361a, 361b each constitute a gap 318 between first and second locking lips 353a, 353b and shown in FIG. 25.

In accordance with another specific feature of the present invention, it should be noted that each of first and second locking lips 353a, 353b has a circumferential length "L3" (FIG. 27). This circumferential length "L3" preferably comprises less than one quarter of the circumference of the sleeve member 312. Typically, the diameter of the first end 314 of meter 326 is about 5½ inches long, which correlates to a circumference of the first end 314 of 17.27 inches long. Preferably, length "L3" is about 4.3 inches long circumferentially. (In the second embodiment of the invention, i.e. meter puller 103, each of the locking lips 153 extends for more than one quarter of the circumference of the sleeve member 112.) The configuration of the first and second locking lips 353a, 353b makes it easier for the meter puller 310 to be engaged with a meter 326 secured to meter mount 325 by way of gripping members 329 than is the case with meter puller 103 if it is engaged by similar gripping members. This is because the increased size of gaps 318 (FIG. 25) defined by first and second circumferential regions 361a, 361b of meter puller 310 over the size of the gaps 161 (FIG. 10) in meter puller 103. Each gap 318 is of a circumferential length "L4" that preferably is more than one quarter of the circumference of sleeve member 312. Preferably length "L4" is greater than 4.3 inches long circumferentially. The increased size gaps 318 ensures that there will be substantially less likelihood of engaging one of the gripping members 329 during engagement of the meter puller 310 with meter 326 than was the case with meter puller 103. This in turn reduces the possibility of accidental electric discharge during engagement. Additionally, the increased size of gaps 318 ensures that there is adequate space for any accidental electrical discharge to vent therethrough, thus increasing the safety of meter puller 310 over meter puller 103. The increased venting size of gaps 318 enables meter puller 310 to be used without a shield, although as indicated previously, a shield may be secured to meter puller 310 without departing from the scope of the invention.

Additionally, it should be noted that the lengths "L2" of third leg 355c of second locking lip 353b and the corresponding third leg of first locking lip 353a are longer than the third legs 155c (FIG. 10) of meter puller 103. This increased length aids in ensuring that a portion of the back surface 328b of base 327 is engaged by third legs 355c. Thus, in the instances where the second region 329b of dome 329 is damaged, there is still sufficient engagement between meter puller 310 and meter 326 for meter 326 to be detached from meter mount 325.

Figure 28:
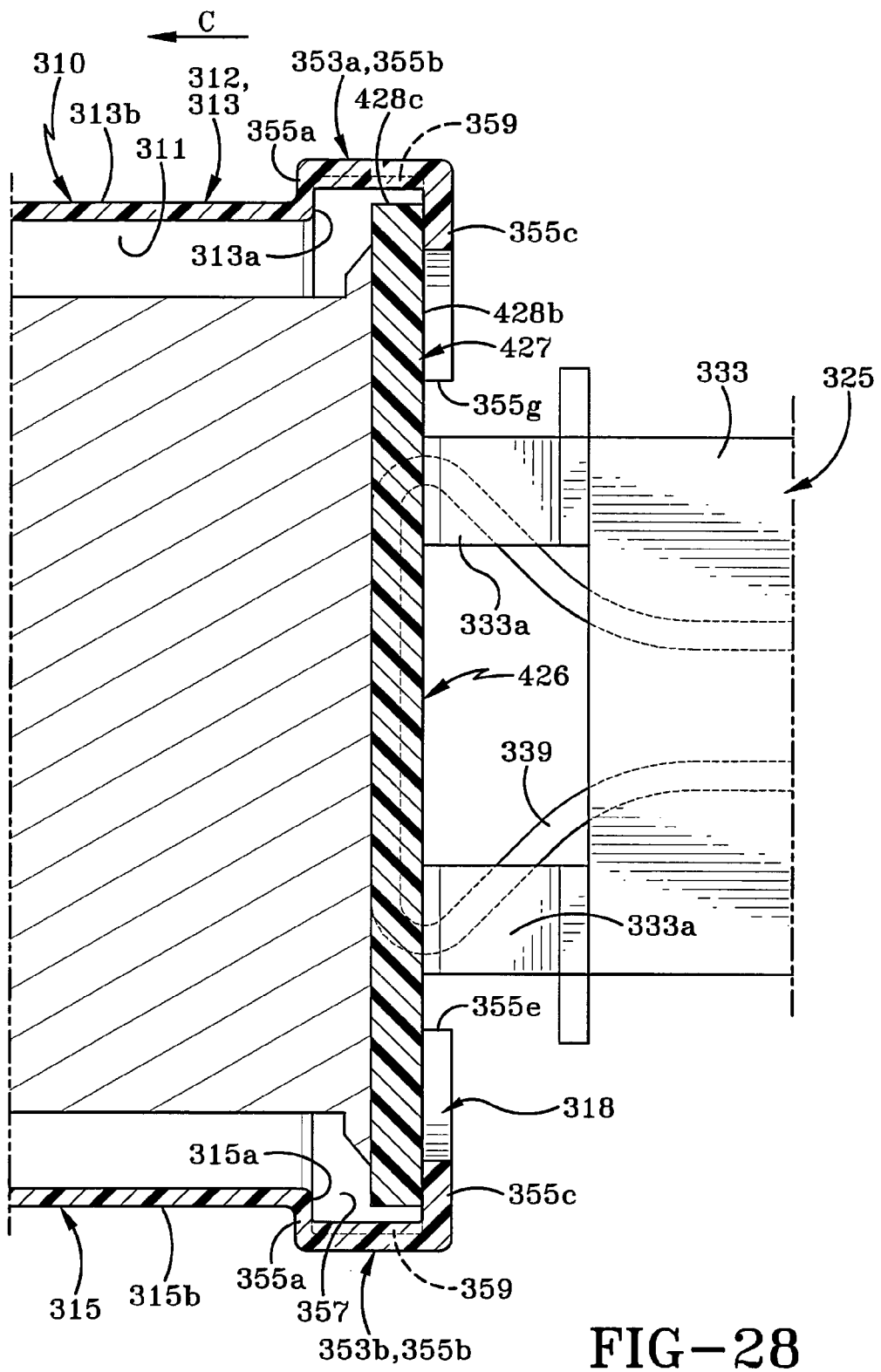
FIG. 28 is a cross-sectional side view of the third embodiment of the meter puller engaged with a damaged or alternative style of meter.

FIG. 28 shows meter puller 310 engaged with a meter 426. Meter 426 is substantially identical to meter 326 with the exception that the dome is directly secured to base 427 directly instead of being secured by way of a bezel such as the second region 329b shown in FIG. 25. The locking lips 353a, 353b of meter puller 310 extend around the peripheral edge 428c of base 427 and the third legs 355c of locking lips 353a, 353b abut back surface 428b. Meter 426 may end up in this configuration if the bezel that is normally part of dome breaks off dome and base 427 remains engaged with stabs mounts 333. In this situation it would be even more dangerous for the operator to attempt to remove meter 426 without the protection provided by meter puller 310.

Meter puller 310 is used in the much the same manner as meter puller 103. The operator pulls actuation handle 377 in the opposite direction to arrow "B" (FIG. 24) to move first and second sleeve portions 313, 315 away from each other. Because the actuator rod 369 is maintained adjacent the side wall 313b of first sleeve portion 313 by actuator guide 401, the motion of cam arm 337 is more readily controlled than was the case with actuation device 169 of meter puller 103. Once the space between the first and second sleeve portions 313, 315 and, more specifically, between first and second locking lips 353a, 353b, has opened up to a sufficient degree to receive meter 326 (or 426) into cavity 311, the operator moves meter puller 310 toward meter 326 in the direction of arrow "B".

Once first and second locking lips 353a, 353b are positioned radially outwardly of second region 329b of dome 329, actuator rod 369 is pushed inwardly toward meter mount 325 in the direction of arrow "B". Once again, because of the restraining action of actuator guide 401, this linear motion of actuator rod 369 is more controlled than was the case in actuation device 169 in meter puller 103. The linear motion of actuator rod 369 causes cam arm 337 to be rotated and this motion translates into movement of first and second sleeve portions 313, 315. First and second locking lips 353a, 353b move inwardly back toward each other and thereby close around second region 329b of dome 329 (or around the peripheral edge 428c of base 427). In this engagement procedure, the increased size gaps 318 between the edges 355d-355g of locking lips 353a, 353b ensures that bracing members 339 on meter mount 325 are adequately and easily cleared.

Once meter puller 310 is fully engaged with meter 326 (426), the operator will pull meter puller 310 in the direction of arrow "C" (FIGS. 25 and 28). The longer length third legs 355c will engage adjacent regions of base 327 (427) and will move the base 327 (427) in the direction of arrow "C". This motion pulls base 327 off stabs mounts 333 and breaks the bracing contact of bracing members 339 and side region 329d of dome 329 (or peripheral edge 428c of base 427). It should be noted that in the motions of moving meter puller 310 toward meter 326 or away therefrom, the operator is able to grasp both handle 324 and handle 403 to more steadily guide the movement of meter puller 310. This ensures that the engagement of meter puller 310 with meter 326 and the subsequent removable of meter 326 with meter puller 310 is conducted in a manner that is less likely to result in accidental electric discharge.

It will be understood that while the above description identifies how meter 326 may be removed from its engagement with meter mount 325, the steps used to remove meter 326 may be reversed to install the same on meter mount 325. Thus, meter puller 310 may be used to both remove and install electrical power meter 326 in a safe fashion.

Accordingly, the power meter puller with safety shield is an effective, safe, inexpensive, and efficient device that achieves all the enumerated objectives of the invention, provides for eliminating difficulties encountered with prior art devices, systems, and methods, and solves problems and obtains new results in the art.

In the foregoing description, certain terms have been used for brevity, clearness, and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries, and principles of the invention, the manner in which the power meter puller with safety shield is constructed and used, the characteristics of the construction, and the advantageous new and useful results obtained; the new and useful structures, devices, elements, arrangement, parts, and combinations are set forth in the appended claims.

The invention claimed is:

1. A tool for installing and removing an electrical power meter comprising:
   a sleeve member having a first end opposite a second end, and a longitudinal axis extending therebetween;
   a cavity defined by the sleeve member;
   an opening to the cavity defined in the first end of the sleeve member; wherein the cavity is adapted to receive a portion of the meter therein through the opening; wherein the sleeve member comprises: a first sleeve portion and a second sleeve portion that are disposed in side-by-side relationship; and wherein the cavity is bound and defined by the first and second sleeve portions;
   an adjustment mechanism provided on the sleeve member; wherein the adjustment mechanism is operable to change the size of the opening to the cavity; and wherein the adjustment mechanism is movable between a first position where the opening is enlarged to permit entry of the meter into the cavity; and a second position where the opening is reduced; and
   an engagement assembly provided at the first end of the sleeve member; said engagement assembly being adapted to engage a portion of the meter when the adjustment mechanism is moved into the second position; wherein the engagement assembly comprises: a first locking lip provided on the first sleeve portion at the first end of the sleeve member; and a second locking lip provided on the second sleeve portion at the first end of the sleeve member.

2. The tool as defined in claim 1, wherein the adjustment assembly includes an articulating mechanism which engages the first and second sleeve portions and is configured to move a region of the first sleeve portion and a region of the second sleeve portion one of toward and away from each other as the adjustment assembly is operated.

3. The tool as defined in claim 2, wherein the movement of the regions of the first and second sleeve portions one of toward and away from each other is disposed substantially at right angles to the longitudinal axis of the sleeve member.

4. The tool as defined in claim 2, wherein the adjustment assembly further includes:
an actuating rod which is engaged with the articulating mechanism; and
an actuating guide extending outwardly from a side wall of one of the first and second sleeve portions; and wherein the actuating rod is movable through the guide from a first position to a second position; and when the actuating rod is moved into the first position, the regions of the first and second sleeve portions are moved away from each other; and when the actuating rod is moved into the second position, the regions of the first and second sleeve portions are moved toward each other.

5. The tool as defined in claim 4, wherein the articulating mechanism includes:
a cam arm; and a first end of the actuating rod is engaged with a cam arm; and movement of the actuating rod in the first direction causes the cam arm to rotate in a first camming direction; and movement of the actuating rod in the second direction causes the cam arm to rotate in a second camming direction.

6. The tool as defined in claim 4, wherein the movement of the actuating rod is linear and is in a plane substantially parallel to the side wall of the one of the first and second sleeve members from which the guide extends.

7. The tool as defined in claim 1, wherein the first locking lip is disposed opposite the second locking lip.

8. The tool as defined in claim 1, wherein the first end of the sleeve member is generally circular and has a circumference; and each of the first and second locking lips is provided on a portion of the circumference of the first end of the sleeve member.

9. The tool as defined in claim 8, wherein each of the first and second locking lips has a circumferential length, and the circumferential length of each of first and second sleeve portions is less than one quarter of the circumference of the first end of the sleeve member.

10. The tool as defined in claim 8, further comprising:
a first gap defined between a first side edge of the first locking lip and a first side edge of the second locking lip; and
a second gap defined between a second side edge of the first locking lip and a second side edge of the second locking lip; and wherein the first and second gaps are adapted to permit venting of any accidental electrical discharge therethrough.

11. The tool as defined in claim 10, wherein the first and second gaps are disposed opposite each other on the circumference of the first end of the sleeve member.

12. The tool as defined in claim 10, wherein each of the first and second gaps has a circumferential length, and the circumferential length of each of the first and second gaps is more than one quarter of the circumference of the first end of the sleeve member.

13. The tool as defined in claim 1, wherein each of the first and second locking lips is U-shaped in cross section and comprises a first leg, a second leg and a third leg; and the first leg thereof is disposed adjacent a side wall of the associated one of the first and second sleeve portions from which the one of the first and second locking lips extends.

14. The tool as defined in claim 13, wherein the first leg of each of the first and second locking lips is integrally formed with and disposed substantially at right angles to the side wall of the associated one of the first and second sleeve portion from which the one of the first and second locking lips extends; and wherein the third leg of each of the first and second locking lips is disposed substantially parallel to the associated first leg thereof.

15. The tool as defined in claim 14, wherein the third leg of each of the first and second locking lips extends inwardly toward the other of the first and second locking lips; and the third leg is of a greater length than the associated first leg.

16. The tool as defined in claim 15, wherein the third leg extends for a distance across the opening to the cavity; and the third leg is adapted to engage a region of a back surface of a base of the meter when the sleeve member is engaged with the meter.

17. The tool as defined in claim 15, further comprising a plurality of ribs extending between the first and third legs of each of the first and second locking lips; and the ribs are disposed at spaced-apart intervals from each other.

18. The tool as defined in claim 1, further comprising a shield which is removably secured to the second end of the sleeve member; and wherein the second end of the sleeve member has an outer perimeter and the shield has an outer perimeter, and the outer perimeter of the shield is disposed radially outwardly of the outer perimeter of the second end of the sleeve member.

* * * * *